United States Patent [19]
Ono et al.

[11] Patent Number: 5,760,854
[45] Date of Patent: Jun. 2, 1998

[54] LIQUID CRYSTAL DISPLAY APPARATUS

[75] Inventors: Kikuo Ono, Naka-machi; Makoto Tsumura, Hitachi; Kazuhiro Ogawa, Mobara; Hiroki Sakuta, Mobara; Masahiko Suzuki, Mobara; Toshiki Kaneko, Chiba; Yoshiaki Nakayoshi, Mobara; Kenichi Onisawa; Kenichi Hashimoto, both of Hitachinaka; Tetsuro Minemura, Hitachioota, all of Japan

[73] Assignee: Hitachi, Ltd., Tokyo, Japan

[21] Appl. No.: 810,734

[22] Filed: Mar. 4, 1997

Related U.S. Application Data

[62] Division of Ser. No. 507,778, Jul. 26, 1995, Pat. No. 5,668,379.

[30] Foreign Application Priority Data

Jul. 27, 1994 [JP] Japan .................... 6-175113
Aug. 24, 1994 [JP] Japan .................... 6-199388

[51] Int. Cl.[6] .................................... G02F 1/1343
[52] U.S. Cl. .................... 349/38; 349/39; 349/44
[58] Field of Search ............... 257/59, 72; 349/38, 349/39, 42, 43, 44

[56] References Cited

U.S. PATENT DOCUMENTS 5,696,566 12/1997 Kim et al. .................... 349/39

Primary Examiner—Minh-Loan Tran
Attorney, Agent, or Firm—Antonelli, Terry, Stout & Kraus, LLP

[57] ABSTRACT

In order to provide a liquid crystal display apparatus having bright image display and a preferred production yield, a gate insulating film under a transparent pixel electrode on a transparent substrate is provided with an aperture smaller than a plane area of the pixel electrode, and a source electrode pattern under the pixel electrode is composed so as to cross the aperture. Thin film transistors (TFT) of the liquid crystal display apparatus have a gate electrode and a laminate layer of a gate insulating film and a semiconductor film. End portions of the gate electrode and the laminate layer are tapered, and the end portion of the gate electrode is tapered with a taper angle equal to or less than three times (where, less than 90°) of a taper angle at the end portion of the laminate layer.

18 Claims, 27 Drawing Sheets

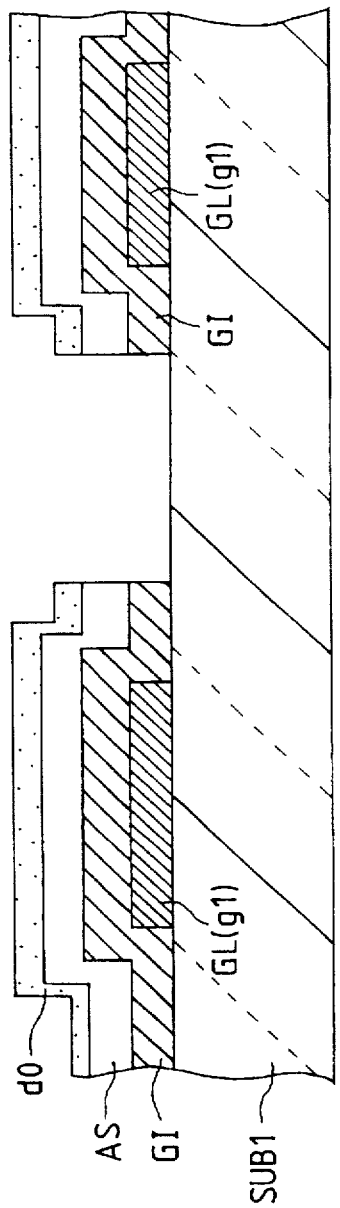
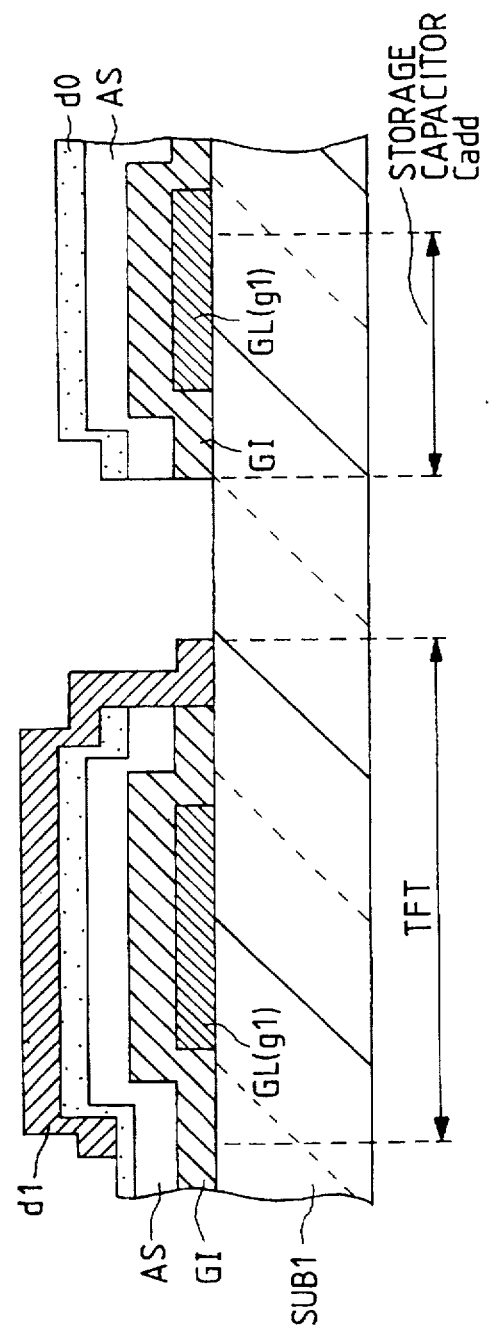

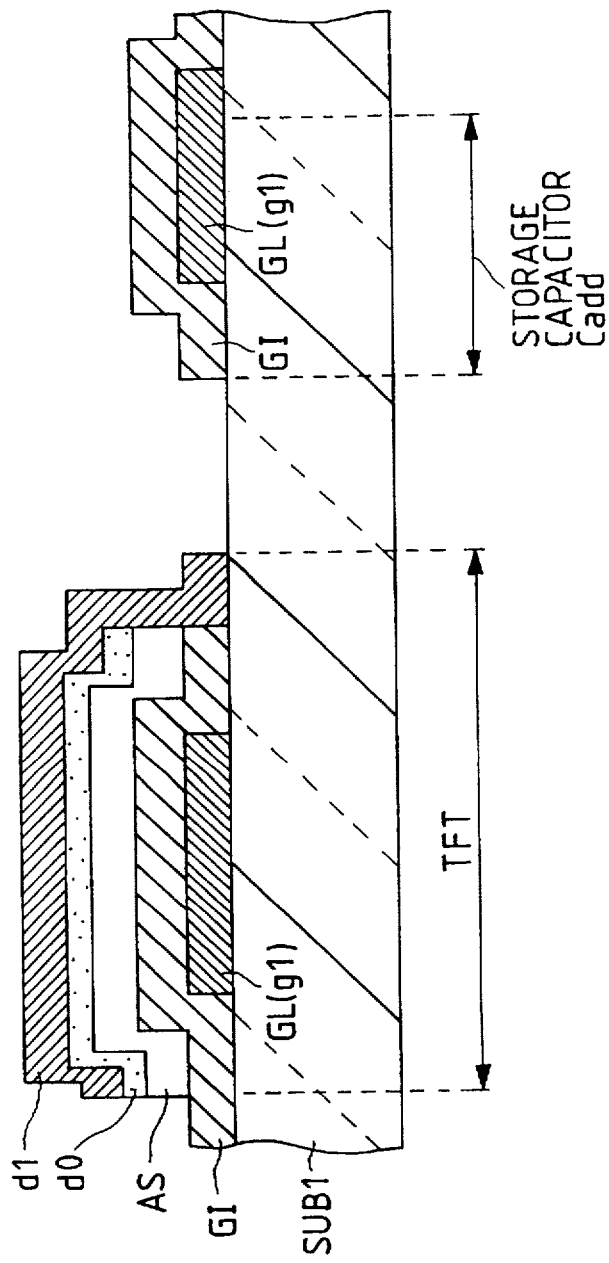

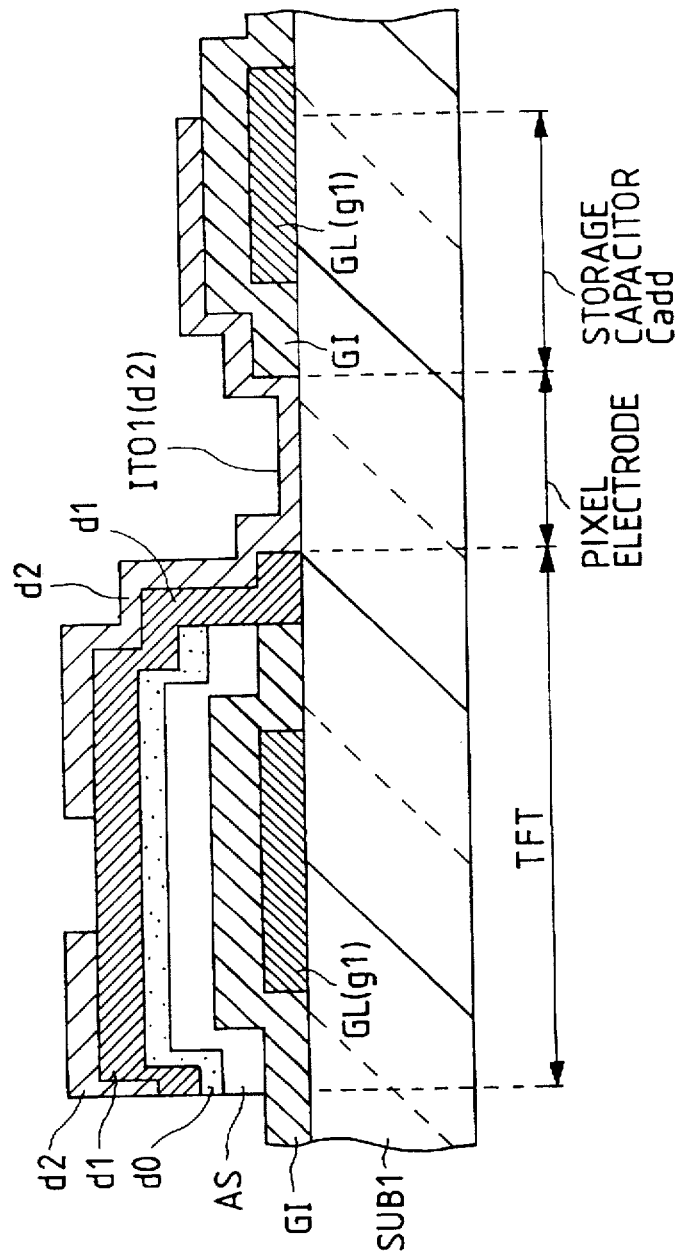

TAPER RATIO = B/A
= 0.62

TAPER RATIO = B/A
= 0.62

5,760,854

LIQUID CRYSTAL DISPLAY APPARATUS

This application is a divisional of application Ser. No. 08/507,778, filed Jul. 26, 1995, now U.S. Pat. No. 5,668,379.

BACKGROUND OF THE INVENTION (1) Field of the Invention

The present invention relates to an active matrix drive type liquid crystal display apparatus using thin film transistors (TFT), and manufacturing methods therefore.

(2) Description of the Prior Art

In an active matrix type liquid crystal display apparatus, switching elements are provided corresponding to respective of plural pixel electrodes arranged in a matrix. In the active matrix type liquid crystal display apparatus, a liquid crystal at a respective pixel is always driven theoretically, and contrast is higher than that of a simple matrix type display apparatus which uses time division drive system. Therefore, the active matrix type technology is indispensable especially for color display.

In accordance with prior art of the active matrix type liquid crystal display apparatus, a thin film transistor (TFT) is composed by being provided with an insulating transparent substrate, whereon a gate electrode (gate line), a gate insulating film, a semiconductor layer, a drain electrode (data line), and a source electrode are provided orderly. Transparent electrodes are connected to the source electrode. The structure of the TFT wherein gate electrodes are formed first on the substrate is generally called an inverted staggered structure. JP-A-61-161764 (1986) disclosed such a TFT.

The liquid crystal display apparatus using TFT is characterized in having high contrast because it is capable of active drive. However, the process for forming a TFT on the substrate is complex, and generally it requires six or more steps of photolithographic process (hereinafter called photo-treatment). When the number of the photo-treatment steps for manufacturing the TFT substrate is large, there are problems such that manufacturing cost of the TFT substrate increases, and further, a production yield of the manufacturing decreases on account of contamination with dust which comes from outside or is generated at the manufacturing process.

One of the methods for simplifying the process, a prior art is disclosed wherein a gate insulating film and a semiconductor layer, and a metallic film to be drain electrodes and source electrodes are formed continuously, the semiconductor layer is manufactured as a mask for the metallic film, and subsequently transparent electrodes are formed.

However, a problem has been generated such that the transparent electrodes are readily broken by a step which is formed by a remaining eaves-shaped end portion of the source electrode if an etching speed of the metallic film composing the source electrodes is slower than an etching speed of the semiconductor layer during the etching process of the semiconductor layer. That means, the production yield of the TFT substrate has not been considered sufficiently.

In order to realize a bright display image, an area of the light transmitting portion of the transparent pixel electrode (hereinafter called aperture ratio) must be as large as possible. However, in accordance with the above prior art, an increase of the aperture ratio for realizing bright display image has not been considered sufficiently.

Further, at a ride over portion of the gate electrode in the TFT semiconductor pattern, a breakage is generated in the semiconductor pattern because an end portion of the semiconductor pattern has a faster etching speed than flat plain portion, and a leak electric current between the semiconductor layer and the gate electrodes increases. Accordingly, it has been a problem that a short circuit (G/D short) among the source electrodes, the drain electrodes, and the gate electrodes which are formed on the semiconductor pattern is readily generated.

SUMMARY OF THE INVENTION (1) Objects of the Invention

One of the objects of the present invention is to provide a manufacturing method for an active matrix type liquid crystal display apparatus with less steps of manufacturing process and a high production yield.

Further, one of the objects of the present invention is to provide an active matrix type liquid crystal display apparatus capable of obtaining a bright display image.

Furthermore, one of the objects of the present invention is to provide a TFT substrate having an electrode structure capable of solving the above short circuit problem, and a liquid crystal display apparatus using such TFT substrate.

(2) Methods Solving the Problems

Step 1; A liquid crystal display apparatus comprising a plurality of gate lines formed on a substrate, a plurality of data lines formed so as to cross a plurality of the gate lines, thin film transistors formed in the vicinity of respective intersections of a plurality of the gate lines and a plurality of the data lines, and pixel electrodes connected to the thin film transistors, and having a function to drive the liquid crystal by the pixel electrodes, wherein a central portion of the pixel electrode was made to contact directly with the substrate, and a peripheral portion of the pixel electrode was made to contact with an insulating film which was the same layer as a gate insulating film composing the thin film transistor.

Step 2; In the above step 1, a conductive film composing the pixel electrode was extended to the source electrode of the thin film transistor, and contours in a plain pattern of a conductive film composing the source electrode were made to cross over contours in a plain pattern at a region of the central portion of the pixel electrode contacting with the substrate.

Step 3; In the above step 1, a light shielding film, which was in parallel with the data lines, and was separated and insulated from the data lines by an insulating film which was the same layer as the gate insulating film composing the thin film transistor, was provided between the data line and a region contacting with the substrate at the central portion of the pixel electrode.

Step 4; In the above step 1, electric conductive lines, which corresponded to respective of a plurality of the gate lines and were in parallel to the gate lines, were provided, and capacitor elements were formed by holding an insulating film between the electric conductive line and the pixel electrode.

Step 5; A liquid crystal display apparatus comprising a plurality of gate lines formed on a substrate, a plurality of data lines formed so as to cross a plurality of the gate lines, thin film transistors formed in the vicinity of respective intersections of a plurality of the gate lines and a plurality of the data lines, pixel electrodes connected to the thin film transistors, and storage capacitors connected to the pixel electrodes, and having a function to drive the liquid crystal by the pixel electrodes, wherein the thin film transistors had a structure forming a gate insulating film on a gate electrode which was composed of a part of the gate line, a semiconductor layer on the gate insulating film, and a source electrode and a drain electrode on the semiconductor layer, an electric conductive film composing the pixel electrode was extended to the source electrode, and the storage capacitor had a structure forming an insulating film which is the same layer as the gate insulating film on the gate line adjacent to the gate line whereon the thin film transistor was formed, and an electric conductive film which was extended from the pixel electrode on the insulating film.

Step 6; In the above step 5, a taper angle formed by the gate insulating film composing the thin film transistor with the substrate at the end portion of the semiconductor layer was made larger than a taper angle formed by the gate insulating film composing the thin film transistor with the substrate at the end portion of the insulating film composing the storage capacitor.

Step 7; In the above step 5, the source electrode was made to contact with the semiconductor layer, the gate insulating film, and the substrate.

Step 8; In the above step 5, a plurality of the data lines comprised semiconductors, and the electric conductive film composing the source electrodes and the drain electrodes, and the above members were placed in a same plain pattern.

Step 9; In the above step 5, the gate lines were coated with an oxide film of the electric conductive film composing the gate line.

Step 10; A manufacturing method for liquid crystal display apparatus having a plurality of gate lines formed on a substrate, a plurality of data lines formed so as to cross a plurality of the gate lines, thin film transistors formed in the vicinity of respective intersections of a plurality of the gate lines and a plurality of the data lines, and pixel electrodes connected to the thin film transistors, and having a function to drive the liquid crystal by the pixel electrodes, comprises the steps of etching both the gate insulating film and the semiconductor layer formed on the gate insulating film in a same processing with an approximately same plain pattern, and subsequently, etching the semiconductor layer selectively.

Step 11; In the above step 10, a metallic film of a given pattern was formed on the semiconductor layer after etching the gate insulating film and the semiconductor layer in a same process, and subsequently the semiconductor layer was etched using the metallic film as a mask.

Step 12; In the above step 10, a process for anodizing a surface of the gate lines was further provided.

Step 13; In the above step 10, sulfur hexafluoride was used as an etching gas in the process of etching the gate insulating film and the semiconductor layer in a same process.

Step 14; In the above step 10, a mixed gas of sulfur hexafluoride and chlorine was used as an etching gas in the process of etching the semiconductor layer using the metallic film as a mask.

Step 15; In the above step 10, the pixel electrodes were formed after etching the semiconductor layer.

Further, features of the present invention to realize the above objects is as follows;

(1) A semiconductor device comprising an insulating substrate whereon a semiconductor pattern consisting of gate electrodes, insulating layer, and semiconductor layer, and source electrodes and drain electrodes formed so as to cross the gate electrodes in the above semiconductor pattern region are provided, wherein the gate electrode of which end portion is tapered and the semiconductor pattern, formed on the gate electrode, of which end portion is tapered are formed so that a taper angle of the gate electrode θg is equal to or less than three times of a taper angle of the end portion of the semiconductor pattern θs (where θg<90°).

(2) A semiconductor device as described above, wherein the gate electrodes are composed of a material selected from a group of Ta, Indium-Tin-Oxide (hereinafter called ITO), $MoSi_2$, $TaSi_2$, $CrSi_2$, $WSi_2$, TiN, TaN, and the taper angle of the gate electrode θg is equal to or less than two times of a taper angle of the end portion of the semiconductor pattern θs (where θg<90°).

(3) A semiconductor device as described in the above paragraph (1), wherein the gate electrodes are composed of a material selected from a group of Cr, Mo, W, Al, Cu, Au, and Ni, and the taper angle of the gate electrode θg is equal to or less than three times of a taper angle of the end portion of the semiconductor pattern θs (where θg<90°).

(4) A semiconductor device as described in the above paragraph (1), wherein the taper angle of the gate electrode θg is in a range of 0.5–3 times of a taper angle of the end portion of the semiconductor pattern θs (where θg<90°).

(5) A semiconductor device as described in the above paragraph (1), wherein the taper angle of the gate electrode θg is in a range of 10°–40°.

(6) A semiconductor device as described in the above paragraph (1), wherein the gate electrode of which end portion is tapered and the semiconductor pattern, formed on the gate electrode, of which end portion is tapered are formed, and the gate electrode and the semiconductor pattern are so composed that a ratio (a taper ratio: B/A) of backed distance from the end of a lower plane to the end of an upper plane of the gate electrode (A) to film thickness (B) is equal to or less than three times of a taper ratio (B'/A') at the end portion of the semiconductor pattern.

(7) A semiconductor device as described in the above paragraph (1), wherein the taper ratio (B/A) of the gate electrode is in a range of 0.2–0.8.

(8) A liquid crystal display apparatus comprising thin film transistors which are arranged in the vicinity of respective intersections of a plurality of scanning signal lines and image signal lines which are formed on one of paired substrates, and of which gate electrode, drain electrode, and source electrode are respectively connected to the scanning signal line, the image signal line, and a pixel electrode, wherein the gate electrode of which end portion is tapered and the semiconductor pattern, formed on the gate electrode, of which end portion is tapered are formed so that a taper angle of the gate electrode θg is equal to or less than three times of a taper angle of the end portion of the semiconductor pattern θs (where θg<90°), and a liquid crystal layer is held between the substrate and the paired another transparent substrate via a liquid crystal alignment film.

(9) A semiconductor device as described in the above paragraph (8), wherein the gate electrode of which end portion is tapered and the semiconductor pattern, formed on the gate electrode, of which end portion is tapered are formed, and the gate electrode and the semiconductor pattern are so composed that a ratio (a taper ratio: B/A) gate electrode film thickness (B) to backed distance from the end of a lower plane to the end of an upper plane of the gate electrode (A) is equal to or less than three times of a taper ratio (B'/A') at the end portion of the semiconductor pattern, and a liquid crystal layer is held between the substrate and the paired another transparent substrate via a liquid crystal alignment film.

In accordance with the above described feature, a length of breakage generated at the tapered end of the semiconductor pattern can be restricted to less than ½ of a slope length of the insulating layer. And accordingly, occurrence of the G/D short circuit can be suppressed.

Further, the semiconductor pattern can provide a matrix type liquid crystal display apparatus comprising thin film transistors as an active element which are arranged in the vicinity of respective intersections of a plurality of scanning signal lines and image signal lines of the liquid crystal display elements, and of which gate electrode, drain electrode, and source electrode are respectively connected in a same layer to the scanning signal line, the image signal line, and a pixel electrode.

The present invention is effective for TFT having an inverted staggered structure wherein the gate electrode is formed under the semiconductor pattern, and similarly, is effective for TFT having a normal stagger structure (top gate structure) wherein the source electrode and the drain electrode are formed under the semiconductor pattern.

The semiconductor pattern relating to the present invention can be formed only with the insulating layer or the semiconductor layer, and is composed so that the semiconductor pattern crosses with the wiring. Further, the semiconductor pattern can be formed on a wiring board of an ordinary electronic device in a similar manner.

In accordance with the present invention, simplification of the manufacturing process and an increase in production yield can be achieved, because, as opening portions in the gate insulating film is fabricated before forming the metallic film for the source electrode and the source electrode is formed at the opening portion, the end portion of the metallic film does not form an eaves shape against the semiconductor layer even if the semiconductor layer is etched using the metallic film of the source electrode as a mask, and accordingly breakage of the transparent electrode can be avoided.

Further, as the gate insulating film under the pixel electrode is provided with an opening portion, transmissivity can be improved. Furthermore, because the light shielding electrode is formed in the vicinity of the data line and the opening portion of the gate insulating film does not exist above the light shielding electrode, high production yield can be obtained, aperture ratio can be increased, and brightness of the display image can be improved.

In accordance with controlling the taper angle at the end portion of the electrodes of TFT, which has a structure that the source electrode and the drain electrode override the gate electrode in the semiconductor pattern having the semiconductor layer and the gate insulating layer, to be less than three times of the taper angle at the end portion of the semiconductor pattern, preferably in a range of 0.5-3 times, the breakage generated at the end portion of the electrodes can be reduced in size, and the G/D short circuit can be prevented. Accordingly, a semiconductor device having high reliability can be obtained.

When the semiconductor pattern is formed by isotropic dry etching, the semiconductor pattern of which end portion has a somewhat taper angle is generally obtained. However, breakage is generated at the tapered end portion, because the etching proceeds faster at the portion overriding the gate electrode than the etching at a plain portion.

If the taper angle at the end portion of the gate electrode is controlled to be less than three times of the taper angle at the end portion of the semiconductor pattern, step coverage of the above insulating layer and the semiconductor layer are improved, a length of the crack generated in the slope at the end portion of the semiconductor pattern can be suppressed in short, leak current from the semiconductor layer caused by failure of insulation at the insulating layer can be suppressed, and a short circuit among the gate electrode, the source electrode, and the drain electrode can be prevented.

If the taper angle at the end portion of the semiconductor pattern is larger than 30°, it is not necessary to make the taper angle at the end portion of the gate electrode so small. When the above taper angle at the end portion of the semiconductor pattern is approximately 20°, crack by etching is hardly generated because the insulating layer at the tapered portion becomes thick, and the taper angle at the gate electrode can be less than 60°.

If the taper angle at the end portion of the semiconductor pattern is smaller than 10°, a length of the crack generated in the slope at the insulating layer of the semiconductor pattern can be suppressed in short by making the taper angle at the end portion of the gate electrode less than three times of the above angle, i.e. <30°, and accordingly, G/D short circuit can be prevented.

If the taper angle of the gate electrode is smaller, the length of the crack generated in the slope at the insulating layer of the semiconductor pattern can be smaller, and the effect for reducing the leak current and the effect for preventing the short circuit are increased. However, if the above taper angle is too small to be necessary, a cross sectional area as an electrode decreases, and resistance as the scanning signal line increases. Therefore, the above taper angle is preferably approximately three times of the taper angle at the end portion of the semiconductor pattern.

The crack generated in the slope at the insulating layer of the semiconductor pattern by etching in the pattern processing is not necessarily prevented perfectly, but if the length of the crack is less than ½ of the length of the tapered slope, a probability of generating the above leak current and the short circuit among the gates is small, and electrically stable transistor characteristics can be achieved. If a length of the crack is less than ⅓ of the length of the tapered slope, the stability can be increased further.

In accordance with the present invention, a liquid crystal display apparatus having a large aperture ratio and bright image display can be provided. Further, a low-cost liquid crystal display apparatus and its manufacturing method can be provided because the TFT substrate composing a display panel can be produced by a simple processing including only 5 times photo-resist steps. Furthermore, a liquid crystal display apparatus having a preferable production yield and its manufacturing method can be provided because breakage of lines at the step portion of the transparent conductive film made of ITO can be prevented effectively.

BRIEF DESCRIPTION OF THE DRAWINGS

FIG. 12 is a cross-sectional view corresponding to the step C in FIG. 9.

FIG. 13 is a cross-sectional view corresponding to the step D in FIG. 9.

FIG. 14 is a cross-sectional view corresponding to the step E in FIG. 9.

FIG. 15 is a cross-sectional view corresponding to the step F in FIG. 9.

DETAILED DESCRIPTION OF THE EMBODIMENTS

The liquid crystal display apparatus of the present invention and manufacturing methods therefore are described hereinafter referring to concrete embodiments.

(Embodiment 1)

Figure 1:
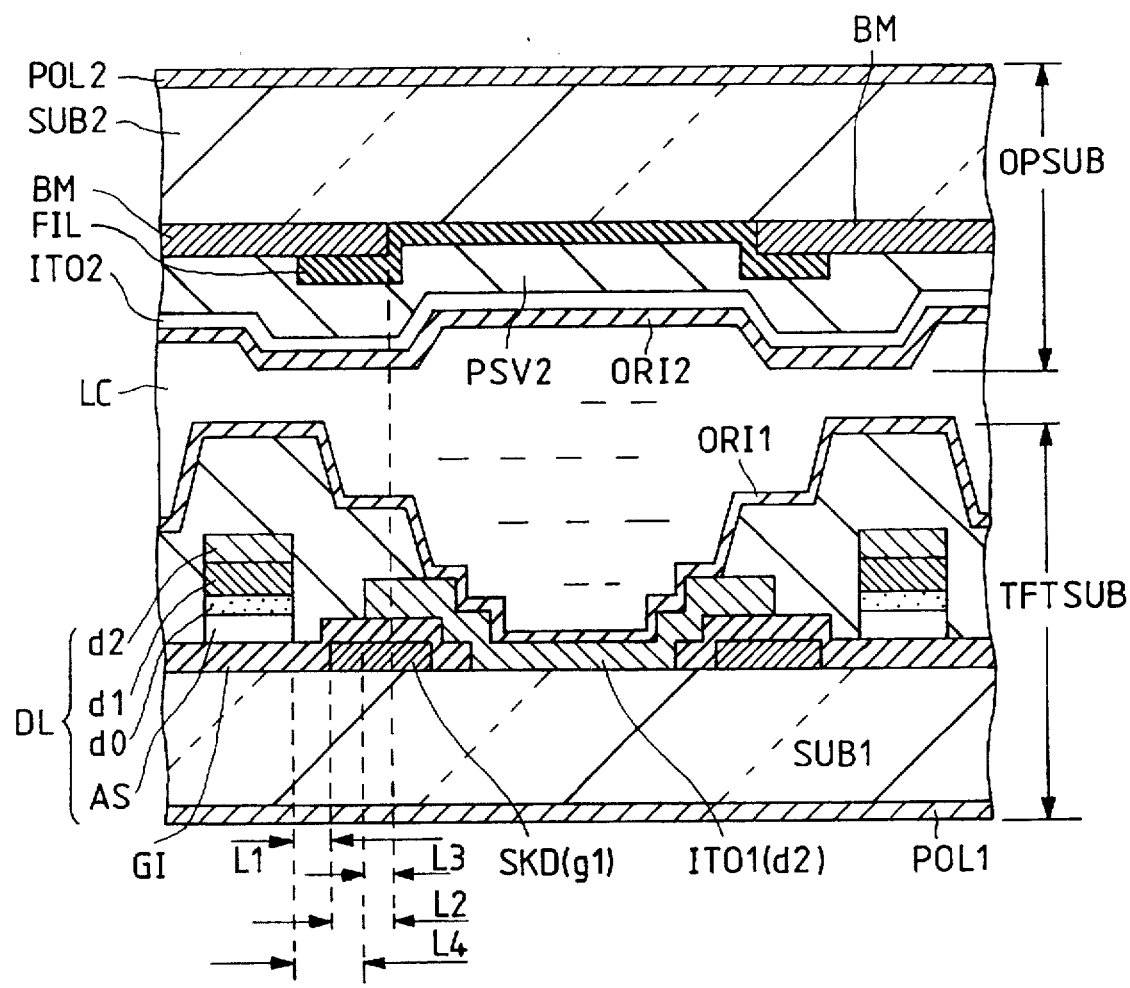
FIG. 1 is a cross-sectional view of the liquid crystal display panel in the embodiment 1 of the present invention (a view taken along the line 1—1 in FIG. 2).

FIG. 1 is a cross-sectional view showing the structure of the matrix portion (display portion) of the display panel in a liquid crystal display apparatus of active matrix type according to the present embodiment. The display panel comprises a TFT substrate TFTSUB made of a transparent glass substrate SUB1 having thin film transistors, pixel electrodes, and various kinds of wiring and others formed on one side surface, a counter substrate OPSUB made of another transparent glass substrate SUB2 having common electrodes ITO2, color filters FIL, and light shielding film BM and others formed on one side surface, and a liquid crystal layer LC filled in an interval between the both substrates facing to each other.

An electro-optical state of the liquid crystal layer LC between the above substrates is controlled by applying an image signal voltage between the pixel electrode and the common electrode ITO2 to change the light transmitting state in the portion of the display panel and to display a given image.

A back light is placed at the counter substrate OPSUB side or the TFT substrate TFTSUB side outside the liquid crystal panel to observe the light transmitted through the pixel portion of the liquid crystal panel from a counter side to the back light.

In the figures to be described hereinafter, the parts having a same function are identified by a same reference symbol.
<TFT substrate>

Figure 2:
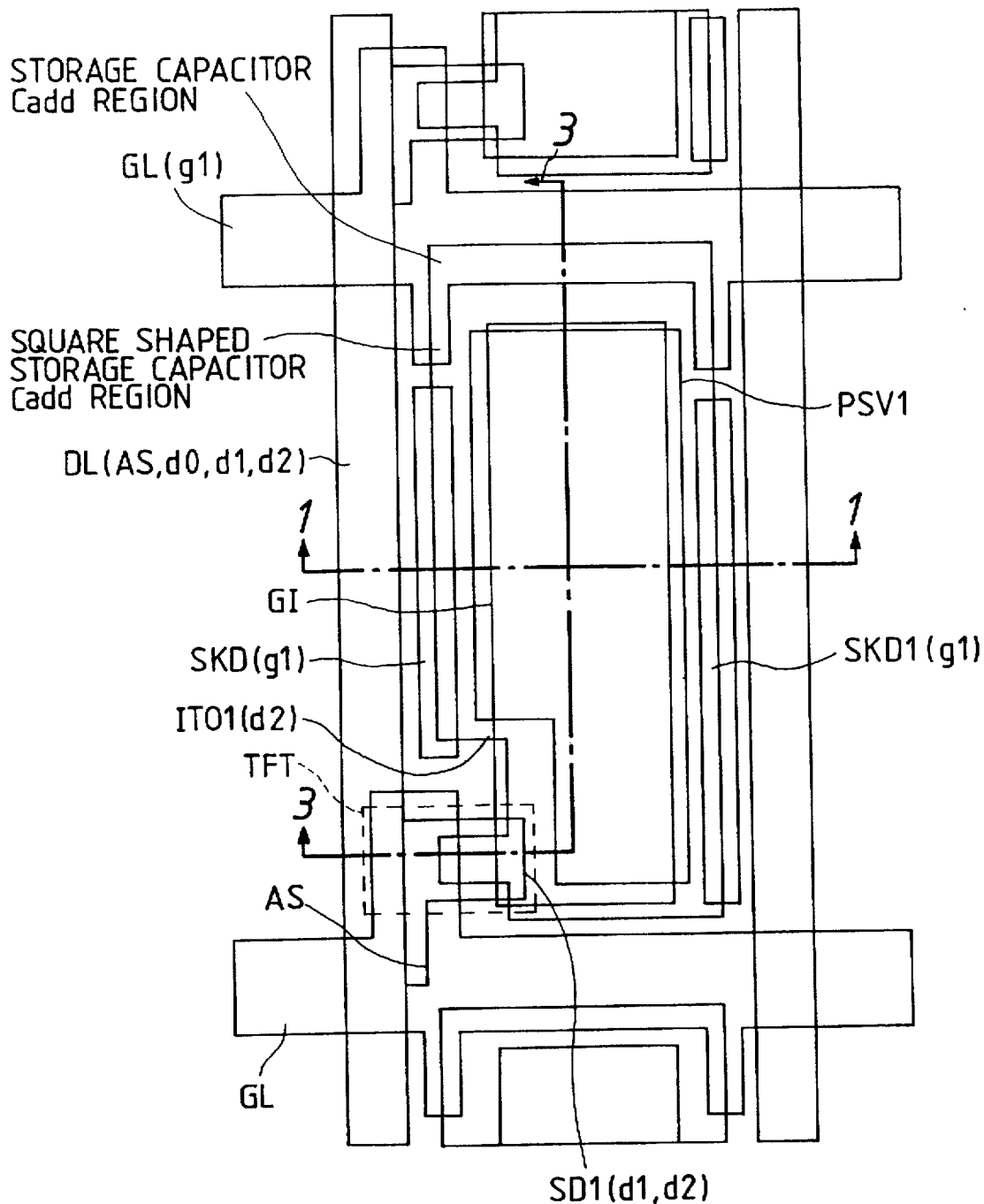
FIG. 2 is a plan view of the patterns of a pixel and layers in its vicinity on a TFT substrate in the embodiment 1.

FIG. 2 is a plan view showing the patterns in a pixel and the vicinity thereof forming each of the layers of a TFT substrate TFTSUB. FIG. 1 is a cross-sectional view taken along the line 1—1 in FIG. 2, and FIG. 3 is a cross-sectional view taken along the line 3—3 in FIG. 2.

Figure 3:
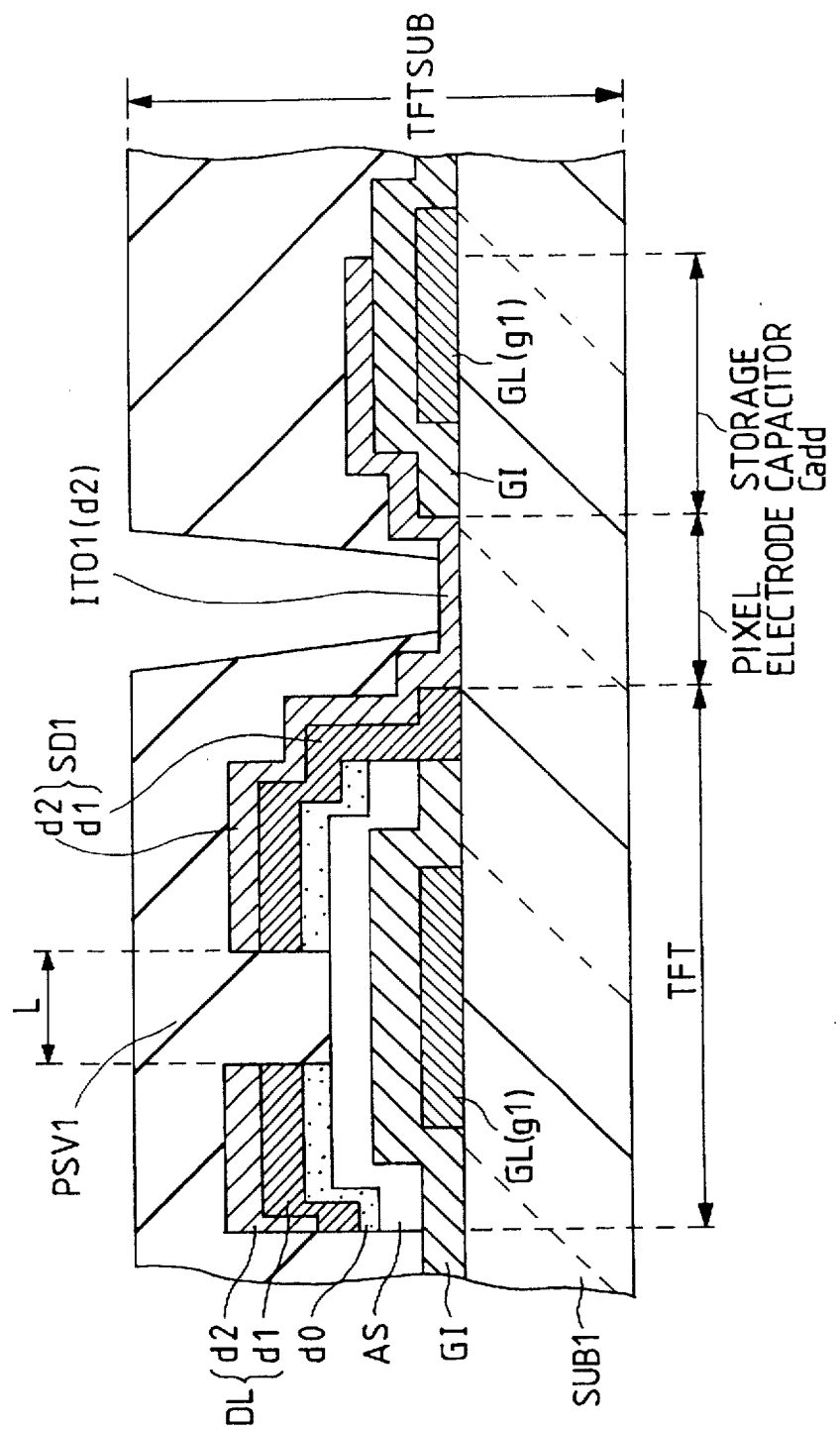
FIG. 3 is a cross-sectional view of a thin film transistor, the pixel, and the vicinity of a storage capacitor on the TFT substrate in the embodiment 1 of the present invention (a view taken along the line 3—3 in FIG. 2).

Next, the structure of the TFT substrate TFTSUB is described in detail referring to FIGS. 1-3. As shown in FIG. 2, a plurality of gate lines (scanning signal lines or horizontal signal lines) GL in parallel to one another and a plurality of data lines (image signal lines or vertical signal lines) DL in parallel to one another intersecting with the gate lines are provided at the surface of the TFT substrate. A region surrounded by the adjacent two gate lines GL and the adjacent two data lines DL becomes a pixel, and a pixel electrode is formed almost all over the region. A thin film transistor (the region surrounded with dashed lines in FIG. 2) as a switching element is formed at the convex portion on the gate line (in FIG. 2, the convex portion upwards) corresponding to each of the pixel electrodes, and the source electrode SD1 thereof is connected to the pixel electrode. The scanning voltage applied to the gate line GL is transferred to the gate electrode of the TFT composed of a part of the gate line to turn the TFT to an ON state. At this time, the image signal supplied to the data line DL is input to the pixel electrode through the source electrode SD1.
<Thin film transistor TFT>

As shown in FIG. 3, the gate line GL is formed on the transparent glass substrate SUB1, and a thin film transistor is composed by forming an insulating layer, a semiconductor layer, and others on the gate line as described later. The thin film transistor operates such that the channel resistance between the source and the drain (data line DL) becomes small when a bias voltage is applied to the gate line GL, and the channel resistance becomes large when the bias voltage is turned to zero.

A gate insulating film GI made of silicon nitride is formed on the gate electrode which is composed of a part of the gate line GL, and an i-type semiconductor layer AS made of amorphous silicon which is intentionally not added with impurities and an N-type semiconductor layer made of amorphous silicon which is added with impurities d0 are formed on the gate insulating film. The i-type semiconductor layer AS composes an active layer of the thin film transistor. The thin film transistor is composed by forming further a source electrode SD1, and a drain electrode (in the present embodiment, a part of the data line DL composes the drain electrode, and the drain electrode is called as the data line DL if it is not specially described) on the i-type semiconductor layer.

As for the gate insulating film GI, for example, a silicon nitride film formed by plasma CVD is employed such as to have a thickness of 2000–5000 Å (in the present embodiment, approximately 3500 Å).

The i-type semiconductor layer AS is formed such as to have a thickness of 500–2500 Å (in the present embodiment, approximately 2000 Å). The N-type semiconductor layer d0 is provided to form ohmic-contacts of the i-type semiconductor layer AS with the source electrode and the drain electrode, and is made of amorphous silicon semiconductor doped with phosphorus (P).

The names of the source electrode and the drain electrode are determined naturally by the polarity of the bias voltage applied between the above electrodes. In the liquid crystal display apparatus relating to the present invention, the source electrode and the drain electrode are altered mutually because the polarity changes during operation. However, in the following description, for the purpose of simplification it is fixed that one is called as the source electrode and the other is called as the drain electrode.

<Source electrode>

As shown in FIG. 3, the source electrode SD1 is formed on a region from the N-type semiconductor layer d0 of the thin film transistor TFT to the vicinity of the pixel electrode on the glass substrate SUB1, and is composed of a laminated film comprising a first conductive layer d1 and a second conductive layer d2. The first conductive layer d1 is formed of chromium (Cr) so as to have a thickness of 600–1500 Å (in the present embodiment, approximately 1200 Å), and the second conductive film d2 is formed of transparent conductive film ITO1 such as Indium-Tin-Oxide (hereinafter abbreviated as ITO). The first conductive film d1 may be formed of a high melting metal (Ti, Ta, W, Mo) other than Cr, and of alloys of the above metals.

The above source electrode SD1 is formed so as to extend into inside of the opening portion of the gate insulating film GI (in FIG. 3, indicated as the pixel electrode) which is formed inside of a pixel region as shown in FIGS. 2 and 3. That is, as shown in FIG. 3, the first conductive film d1 forming the source electrode SD1 and the second conductive film d2 thereon are formed in the pixel region so that at least a part of them contact with the glass substrate SUB 1.

In accordance with the above structure, the transparent electrode d2 can preferably override the step at the lower first conductive film d1 without causing any breakage of line. The above structure will be described in detail later in connection with the description of a manufacturing method. Especially, the above effect is significant when the transparent conductive film d2 is made of ITO, as in the present embodiment. Because ITO has a large crystal a grain size, etching speed at a grain boundary part of the crystal grain differs from the etching speed at the crystal grain itself, and is faster than that at the crystal grain itself. Therefore, if the step portion under the transparent conductive film d2 is not manufactured in a proper tapered shape, the ITO readily causes breakage of the line.

In view of the above aspect, if the semiconductor is etched using the metallic film as a mask on the semiconductor film as disclosed in JP-A-61-161764 (1986), the metallic film is formed in an eaves shape in the cross sectional structure, and the transparent conductive film readily causes breakage of the line. On the contrary, the breakage of line at the step portion hardly occurs as described above.

As described later in connection with the manufacturing method, the opening of the gate insulating film GI is formed before forming of the first conductive film d1 in the present embodiment, and the first conductive film d1 is formed on the glass substrate SUB1 exposed by the previous process for forming the opening. When a gas containing fluorine, which is a conventional dry etching gas for the semiconductor, is used for the dry etching, a dry etching speed of the glass is slower than that for the semiconductor silicon. Therefore, the present embodiment has a feature such that the end portion of the first conductive film d1 does not form the eaves shape even if the i-type semiconductor AS is selectively etched against the gate insulating film GI using the first conductive film as a mask, the second conductive film composing the source electrode SD1 does not cause any breakage of the line, and a preferable production yield can be obtained.

Further, in accordance with forming the opening at the gate insulating film GI, light absorption at the pixel electrode portion is reduced and transmissivity becomes larger than a case when the opening is not formed, and a liquid crystal display apparatus having preferably bright image display can be obtained.

<Pixel electrode>

The pixel electrode is formed of a transparent conductive film ITO1, connected to the source electrode SD1 of the thin film transistor, and is formed in a body with the transparent conductive film d2 composing the source electrode. The transparent conductive film ITO1 is formed of a sputtering film of ITO to be 300–3000 Å in thickness (in the present embodiment, approximately 1400 Å).

<Gate line GL>

The gate line GL is formed of a mono-layer of the conductive film g1 as shown in FIG. 1. As for the conductive film g1, a chromium (Cr) film formed through sputtering to have a thickness of 600-1500 Å (in the present embodiment, approximately 1200 Å) is used. The conductive film g1 can be formed of a metal or an alloy having high melting temperature as same as the first conductive film d1.

<Data line>

The data line DL is formed on the gate insulating film GI on the transparent glass substrate SUB1 as shown in FIG. 1. The data line has a laminated structure composed of the i-type semiconductor layer AS, the N-type semiconductor layer d0, the first conductive film d1, and the transparent conductive film d2, all of which have approximately a same plain pattern. Among the above layers and the films, the conductive film d1 and the conductive film d2 mainly contribute to electric conductivity and have a function to transmit signals.

<Storage capacitor Cadd>

The storage capacitor Cadd has a function to prevent attenuating capacitance of the liquid crystal layer LC and dropping voltage in turning off the TFT, and is provided to each of the pixels. As shown in FIG. 3, the storage capacitor Cadd at each of the pixels is formed in an intercrossing region of the pixel with the preceding stage gate line GL, adjacent to the gate line GL whereon the TFT in the same pixel is formed, in a manner that the gate insulating film GI is held between the gate line GL and the pixel.

<Shielding electrode SKD and Rectangular storage capacitor TCadd>

As shown in FIG. 1, the shielding electrode SKD is formed of the same conductive film g1 composing the gate line GL at the surface of the transparent glass substrate SUB1 of the TFT substrate TFTSUB. On the other hand, the rectangular storage capacitor TCadd is formed in an intercrossing region of the pixel with the convex portion of the gate line GL in a manner that the gate insulating film is held between the pixel and the convex portion of the gate line as shown in FIG. 2.

The shielding electrode SKD and the rectangular storage capacitor TCadd are formed in a plain structure so as to overlap with the pixel electrode along the drain line DL as shown in FIG. 2. On the other hand, in a cross sectional structure, the shielding electrode SKD is separated and insulated by the gate insulating film GI from the data line DL as shown in FIG. 1.

The shielding electrode SKD and the rectangular storage capacitor TCadd have a function to increase a ratio of the pixel electrode area to the pixel area, i.e. an aperture ratio, so as to improve brightness of the image display panel. In the display panel shown in FIG. 1, the back light is placed at either of the counter substrate OPSUB side or the TFT substrate TFTSUB side. Hereinafter, it is conveniently assumed that the back light is placed at the counter substrate side OPSUB, and observation is performed from the TFT substrate TFTSUB side. Incident light transmits through the glass substrate SUB2, and enters into the liquid crystal layer through intervals of the shielding film BM formed of the chromium (Cr) film at the liquid crystal LC side surface of the glass substrate SUB2. The incident light is controlled by a voltage applied between the transparent common electrode ITO2 formed on the counter substrate OPSUB and the pixel electrode formed on the TFT substrate.

In a case when the display panel is a normally white mode, if the shielding film BM does not exist, leak light which is not controlled by the voltage (uncontrolled light) leaks through an interval (L1 in FIG. 1) between the data line DL and the shielding electrode SKD, and accordingly, contrast in the display decreases. Further, a designated distance L4 between the data line Dl and the pixel electrode must be retained so as to prevent generating a spot defect caused by short circuit of the above line and electrode because the data line Dl and a periphery of the pixel electrode are formed on the same gate insulating film GL As the interval between the TFT substrate TFTSUB and the counter substrate OPSUB is as large as 5 μm, an adjusting distance L2 for the above interval between the shielding film BM and the data line DL must have a corresponding designated distance. On the other hand, as the shielding electrode SKD is separated and insulated by the data line DL and the gate insulating film GI, probability of short circuit occurrence is small, and accordingly, it can be set smaller than L4. Therefore, the aperture ratio can be increased as much as the shielding electrode comes closer to the data line DL than the adjusting margin L3 necessary for the shielding film BM and the pixel electrode when the shielding electrode SKD does not exist.

The rectangular storage capacitor TCadd also contributes to increasing the aperture ratio by the same effect as the shielding electrode SKD. Further, the rectangular storage capacitor TCadd has another effect as described hereinafter. That is, as the TCadd is formed at the convex portion of the gate line GL, a static shield effect of the convex portion reduces static effect given to the pixel capacitor (a capacitor formed by the pixel electrode, the transparent conductive film ITO2 formed on the counter substrate, and the liquid crystal layer held between the above electrode and film) by change in voltage of the data line DL.

<Passivation film>

As shown in FIGS. 1 and 3, the surface of the TFT substrate TFTSUB on the side having the thin film transistor is covered with a passivation film PSV1 except the center portion of the pixel electrode, and the gate terminal portion and the drain terminal portion provided in the periphery of the TFT substrate as described later. By forming an opening of the passivation film PSV1 at an upper portion of the pixel electrode, light absorption by the passivation film at the opening portion can be eliminated, and accordingly, transmissivity of the display panel, i.e. brightness, can be increased. The passivation film PSV1 is formed for mainly protecting the thin film transistor TFT from moisture, and others. The passivation film PSV1 is formed of silicon oxide film or silicon nitride film of 2000 Å–8000 Å thickness by, for example, plasma CVD.

<Gate terminal portion GTM>

Figure 4:
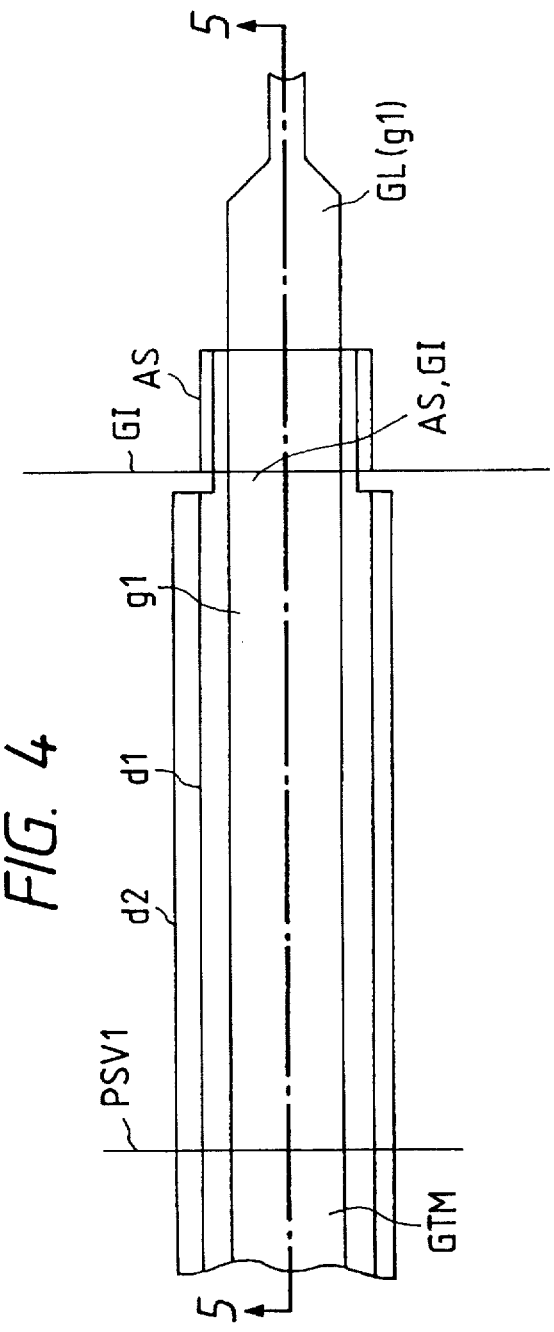
FIG. 4 is a plan view showing the vicinity of a connecting portion of a gate terminal GTM and a gate line GL.
Figure 5:
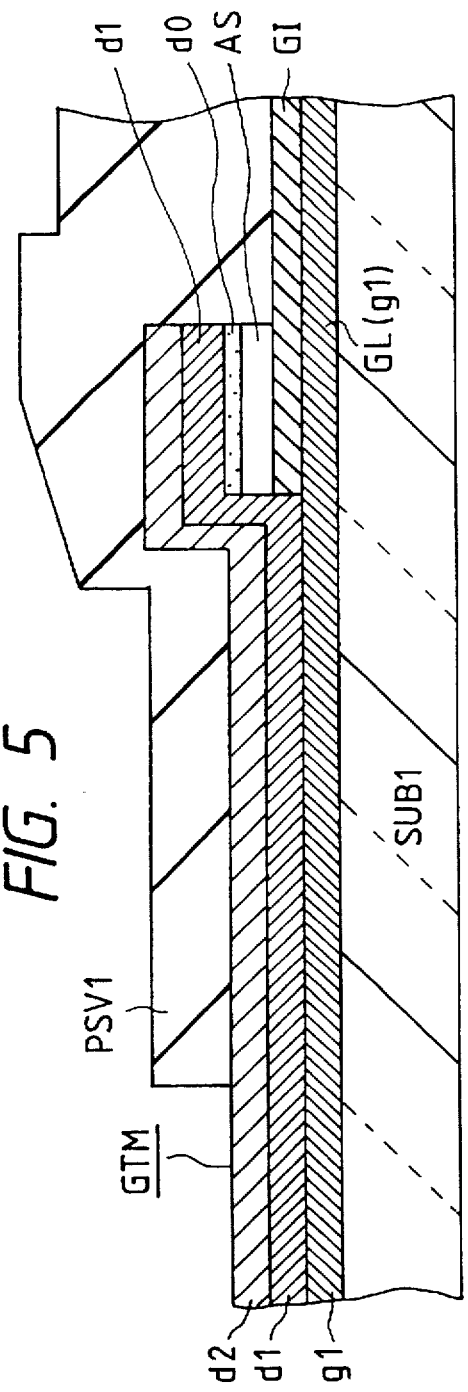
FIG. 5 is a cross-sectional view showing the vicinity of a connecting portion of a gate terminal GTM and a gate line GL.

FIG. 4 is a plan view showing the area from the end portion of the gate line GL on the TFT substrate to a gate terminal GTM which is a connecting portion with an external driving circuit, and FIG. 5 is a cross sectional view taken along the line 5—5 in FIG. 4.

The gate terminal GTM is composed of laminated films of the conductive film g1 forming the gate line GL, and the first conductive film d1 and the transparent conductive film d2 forming the data line DL. The transparent conductive film d2 is exposed to the external. The transparent electrode formed of ITO protects the first conductive film d1, and the conductive film g1, under the conductive film d1 made of Cr from the exterior environment. The transparent conductive film of the gate terminal GTM is formed together with the transparent conductive films ITO1 forming the pixel electrode and the data line. The first conductive film d1 has a larger pattern than that of the conductive film g1, and the transparent conductive film d2 has a larger pattern than the first conductive film d1. The reason is to prevent losing the conductive film g1 formed of chromium as same as the first conductive film d1 after forming the gate insulating film GI, and to prevent corrosion of the conductive film g1 and the first conductive film d1 formed of chromium due to entering of chemicals or moisture. In the above construction, The transparent conductive film ITO1 (d2) is the only one exposed to the external other than the passivation film PSV1. The ITO is made of oxides, and is significantly resistant to oxidation reactions which cause the corrosion. Therefore, the above described structure has a strong reliability.

As described above, the liquid crystal display apparatus using TFT can be manufactured with a preferable production yield and be improved in reliability by coating the metallic conductive film composing the gate terminal GTM with ITO. In the above point of view, the opening of the gate insulating film GI under the transparent conductive film d2 formed of ITO must be manufactured before forming the conductive film d2. Further, the i-type semiconductor AS and the gate insulating film GI at the step portions under the ITO must be manufactured in a preferable taper, as previously described.

<Drain terminal GTM>

Figure 6:
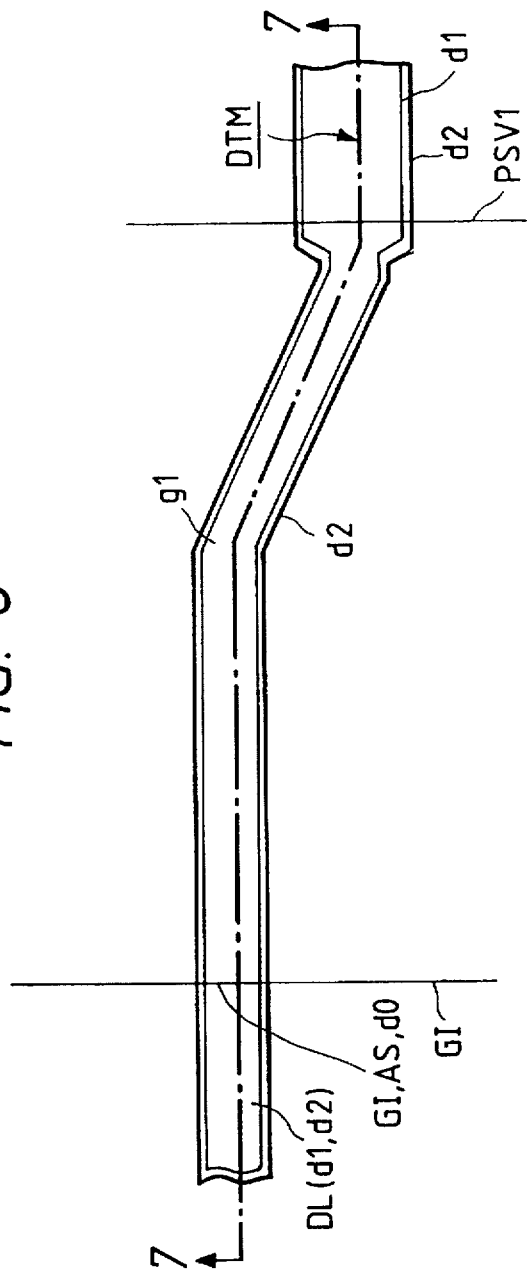
FIG. 6 is a plan view showing the vicinity of a connecting portion of a drain terminal DTM and a data line DL.
Figure 7:
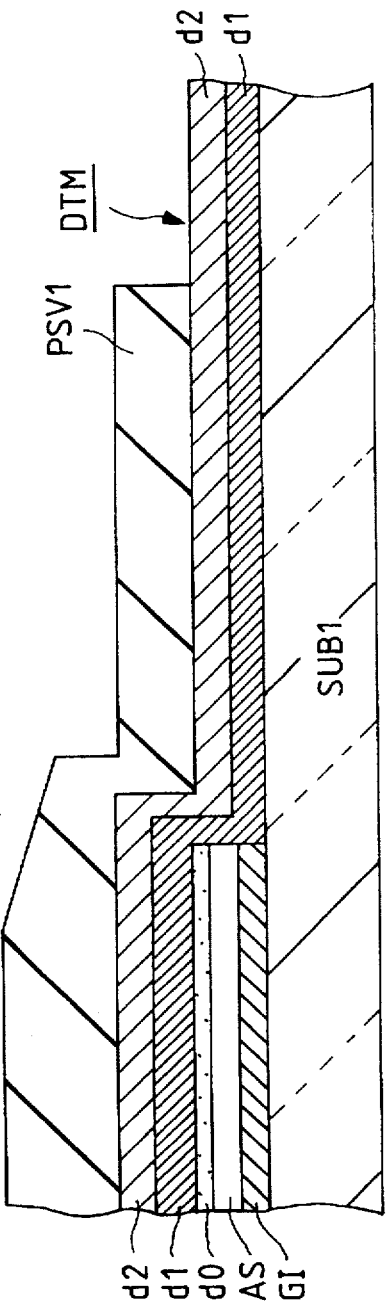
FIG. 7 is a cross-sectional view showing the vicinity of a connecting portion of a drain terminal DTM and a data line DL.

FIG. 6 is a plan view showing the area from the end portion of the data line DL on the TFT substrate to a connecting portion to an external driving circuit of a drain terminal DTM, and FIG. 7 is a cross sectional view taken along the line 7—7 in FIG. 6.

With the same reason as the above described gate terminal GTM, the drain terminal DTM is composed of two layers of the first conductive film d1 made of chromium composing the data lines DL and the transparent conductive film d2 made of the transparent conductive film. The transparent conductive film is formed with a wider pattern than that of the first conductive film. The passivation film PSV1 in the portion of the drain terminal is removed so as to be connected with to an external circuit.

Figure 8:
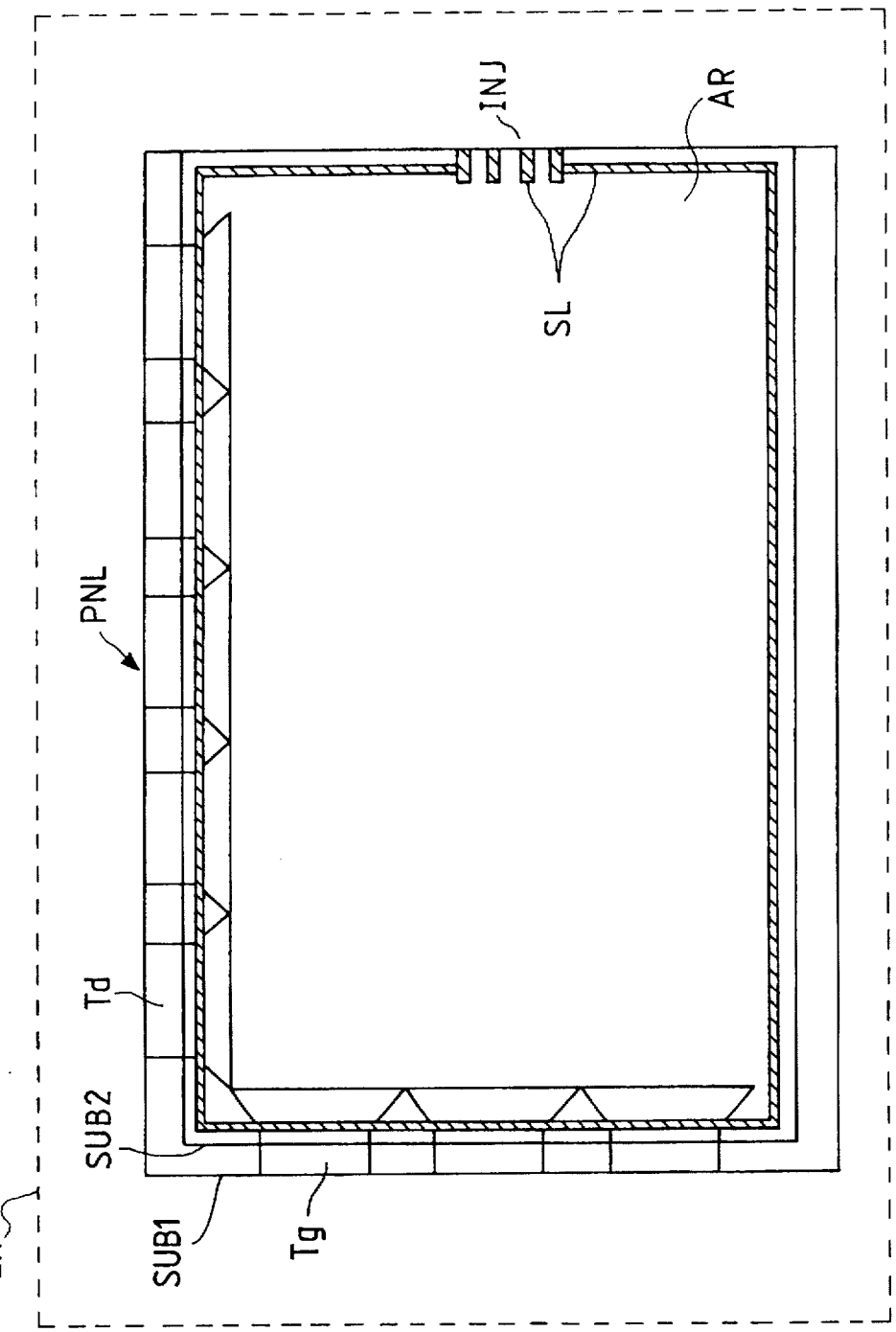
FIG. 8 is a plan view for explaining the structure in the periphery of the matrix of the display panel.

FIG. 8 is a plan view showing the structure in the peripheral portion of the display panel. In the periphery of the TFT substrate TFTSUB (SUB1), the plural gate terminals GTM corresponding to each of the gate lines are arranged to form a group of gate terminals Tg. Similarly, the plural drain terminals DTM corresponding to each of the data lines are arranged to form a group of drain terminals Td. The INJ in FIG. 8 is a portion whereon the seal pattern SL for adhering the TFT substrate TFTSUB and the counter substrate OPSUB is not formed, and after the above two substrates are adhered, liquid crystal is filled from the portion.

<Counter substrate OPSUB>

As shown in FIG. 1, a shielding film BM, a color filter having three colors of red, green, and blue FIL, a passivation film PSV2, common transparent pixel electrode ITO2, and an alignment film ORI2 are successively laminated on one side surface of the transparent glass substrate SUB2. A polarizing plate POL2 is adhered to another side surface of the transparent substrate SUB2. Transmitted light is polarized by the above polarizing plate POL2 and the polarizing plate POL1 which is adhered to one side surface of the TFT substrate TFTSUB whereon the TFT is not formed.

The above shielding film BM is formed of chromium sputtered film, so that the shielding film performs two functions, one is a shielding function to shield light from the uncontrolled region of the display panel, and another is a black matrix function to improve contrast by surrounding the periphery of each pixel as a picture frame.

<Manufacturing method of the TFT substrate TFTSUB>

Figure 9:
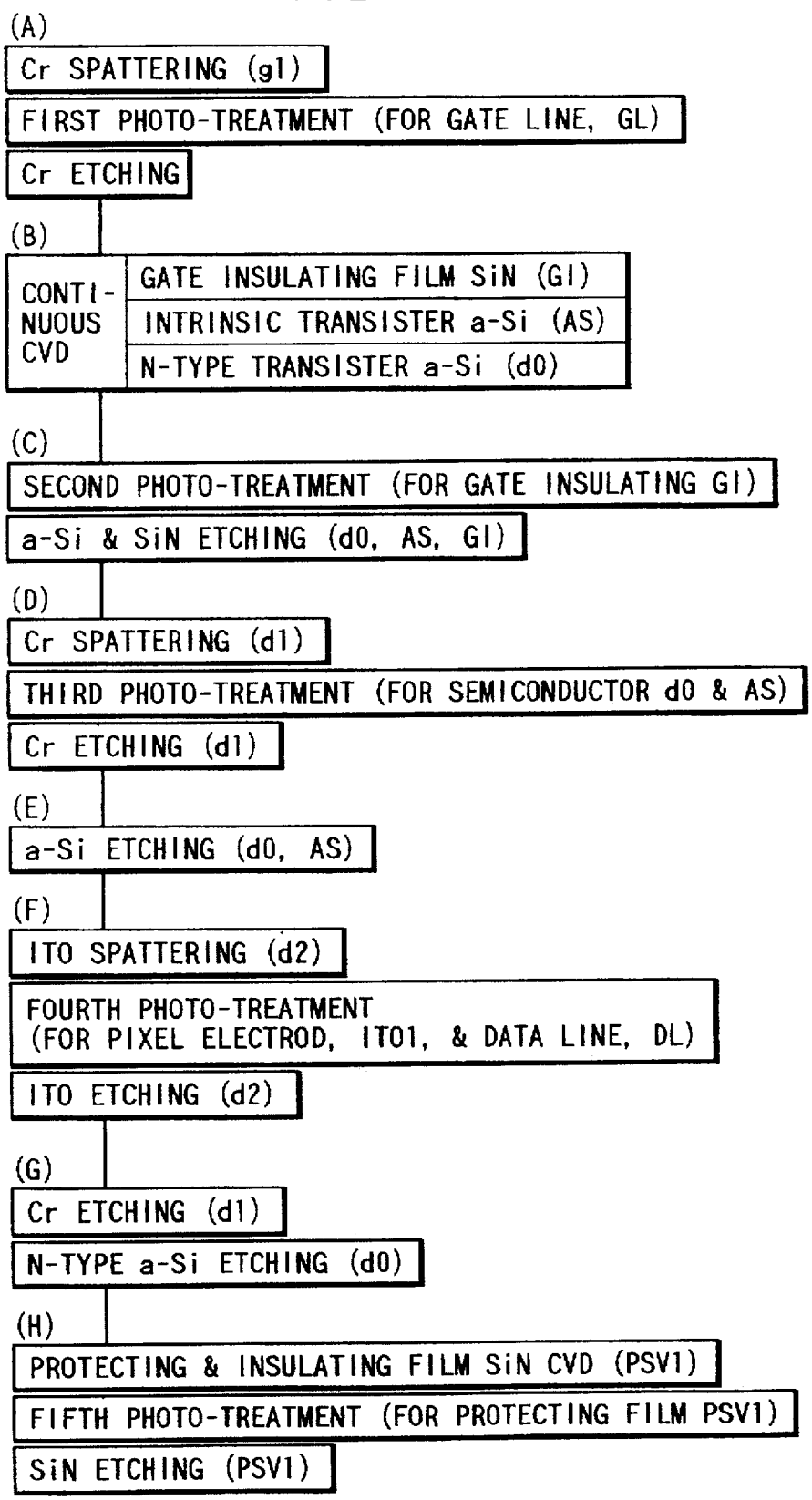
FIG. 9 is a flow chart indicating a manufacturing process for the TFT substrate TFTSUB of the liquid crystal display apparatus in the embodiment 1.
Figure 10:
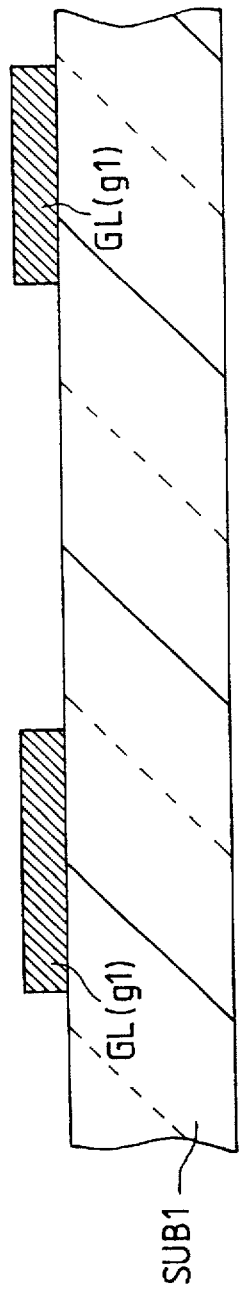
FIG. 10 is a cross-sectional view corresponding to the step A in FIG. 9.

Next, the manufacturing method of the above described TFT substrate TFTSUB is described hereinafter referring to FIGS. 9–16. FIG. 9 is a flow chart summarizing a flow of manufacturing steps in a manufacturing process using a name of each step. A plurality of the steps related to each other are gathered for forming a sub-process, and each of the sub-processes is designated by marks as (A), (B), (C), and so on. FIGS. 10–16 correspond to final cross sectional structures at each of the above sub-processes designated as (A) to (G). These figures are cross sectional views of the vicinity of the connecting portion of the thin film transistor with the pixel electrode and the storage capacitor on the TFT substrate (refer to the cross sectional view in FIG. 3). FIG. 3 corresponds to the cross sectional structure after finishing the sub-process (H) in FIG. 9. Each of the sub-processes of (A), (C), (D), (F), and (H) includes a photo-treatment process. The photo-treatment process means a series of works from application of photoresist to development through selective exposure using a photomask in the description of the present invention. As FIG. 9 reveals, the TFT substrate of the present embodiment is manufactured through five times of the photo-treatment processes.

Figure 17:
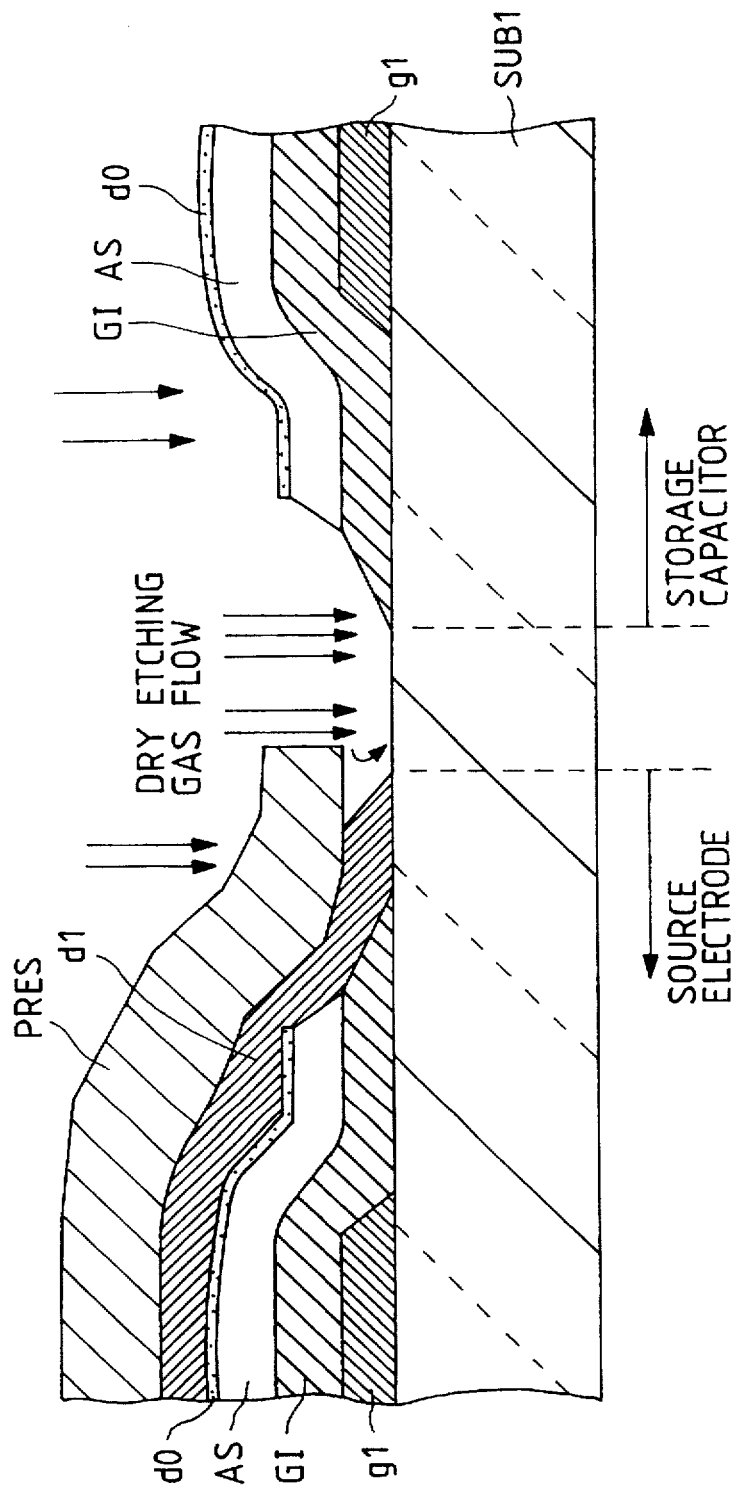
FIG. 17 is a cross-sectional view of the thin film transistor and the storage capacitor when a Cr electrode of the data line is manufactured by the manufacturing method of the present invention.
Figure 18:
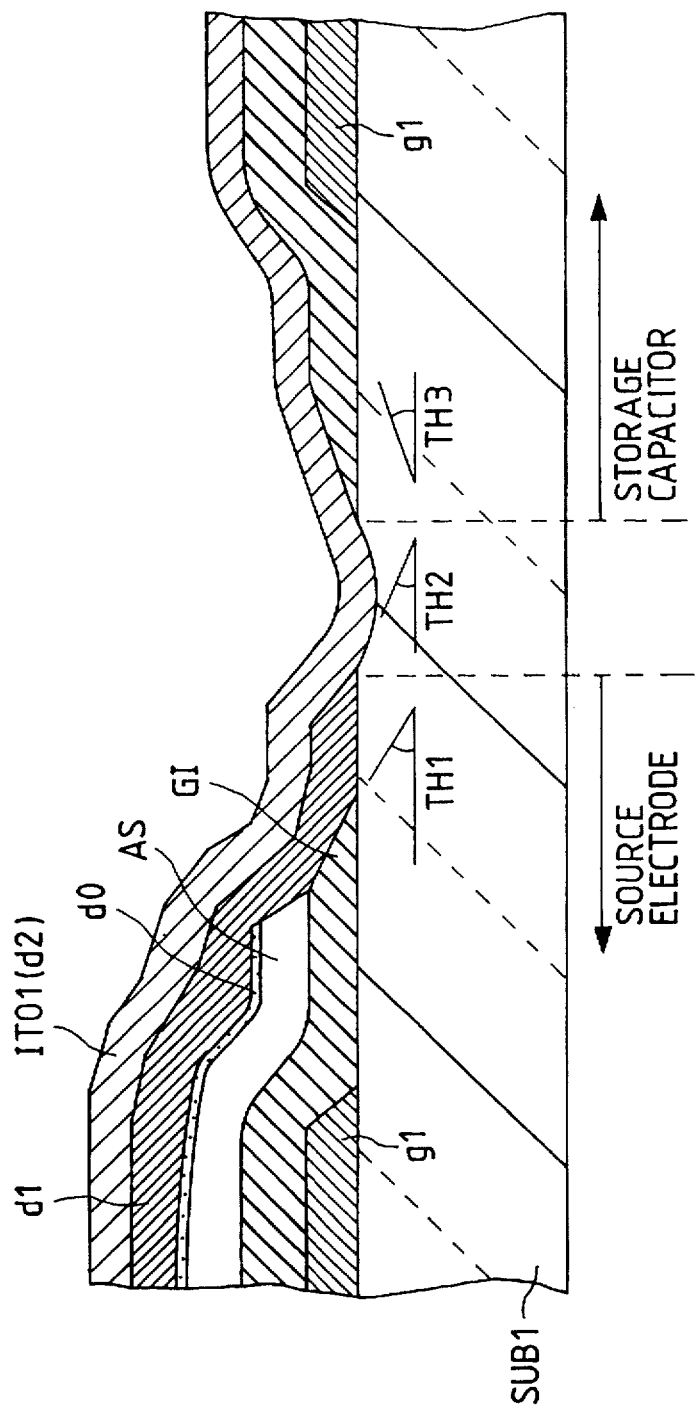
FIG. 18 is a cross-sectional view of the thin film transistor and the storage capacitor when a transparent pixel electrode is formed by the manufacturing method of the present invention.

FIG. 17 is a cross sectional structure drawn close to the real shape of the respective thin film just before an etching process of a-Si after finishing the third photo-treatment process in the sub-process (D) in FIG. 9. FIG. 18 is similarly a cross sectional structure close to the real shape of the thin films after ITO sputtering in the sub-process (F) in FIG. 9. Hereinafter, each process is described successively.

By preparing a transparent glass substrate SUB1, a chromium film is wholly formed on one of the surfaces of the substrate SUB1 by sputtering. After forming a mask having a given pattern on the chromium film by a photo-treatment (first photo-treatment), the chromium film is selectively etched to form a conductive film g1 having the given pattern (the process (A), FIG. 10).

Figure 11:
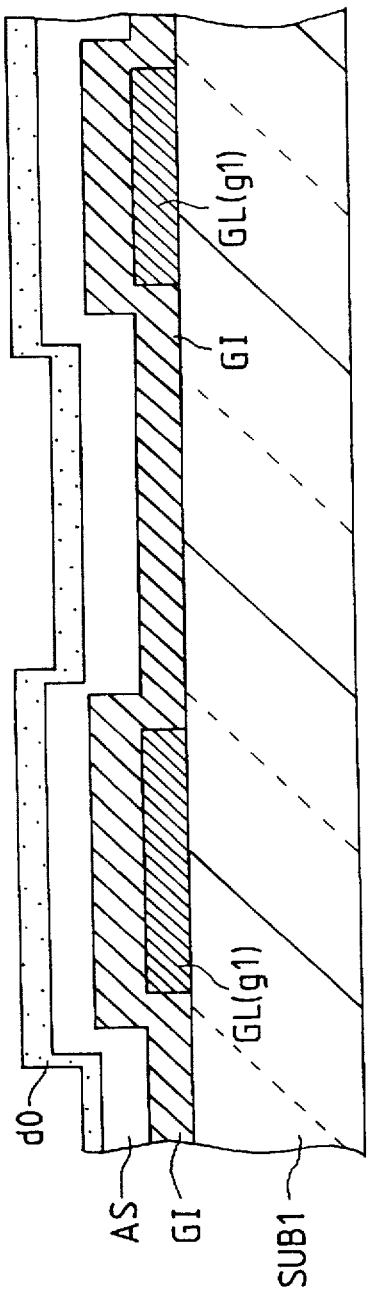
FIG. 11 is a cross-sectional view corresponding to the step B in FIG. 9.

Subsequently, on the conductive film g1 formed on the one surface of the transparent glass substrate SUB1, silicon nitride film GI, i-type amorphous silicon film AS, and N-type amorphous film d0 are successively laminated by a plasma CVD apparatus (the process (B), FIG. 11).

After forming a mask by the photo-treatment (second photo-treatment), a portion for becoming a pixel of the respective three layers of the N-type semiconductor layer d0 (N-type amorphous Si), i-type semiconductor layer AS (i-type type amorphous Si), and the gate insulating film GI (silicon nitride) is removed by etching using $SF_6$ gas (the process (C), FIG. 12).

Next, a chromium film is formed on the above processed substrate by sputtering. After forming a mask having a given pattern by the photo-treatment (third photo-treatment) on the chromium film, the chromium film is selective etched to form a conductive film d1. In this treatment, the end portion of the first conductive film d1 extending from the thin film transistor TFT is formed at the opening formed by the above treatment on the transparent glass substrate SUB1 (the process (D), FIG. 13).

Then, using the mask for the first conductive film d1 formed by the previous process, the N-type semiconductor layer d0 and the i-type semiconductor layer AS are selectively removed by etching using a mixture of $SF_6$ and $BCl_3$ (the process (E), FIG. 14).

Next, a transparent conductive film d2 made of ITO film is formed by sputtering. After forming a mask by the photo-treatment (fourth photo-treatment), the transparent conductive film is selectively etched using an HBr solution to form an ITO pattern on the transparent conductive film ITO1 (the process (F), FIG. 15).

Figure 16:
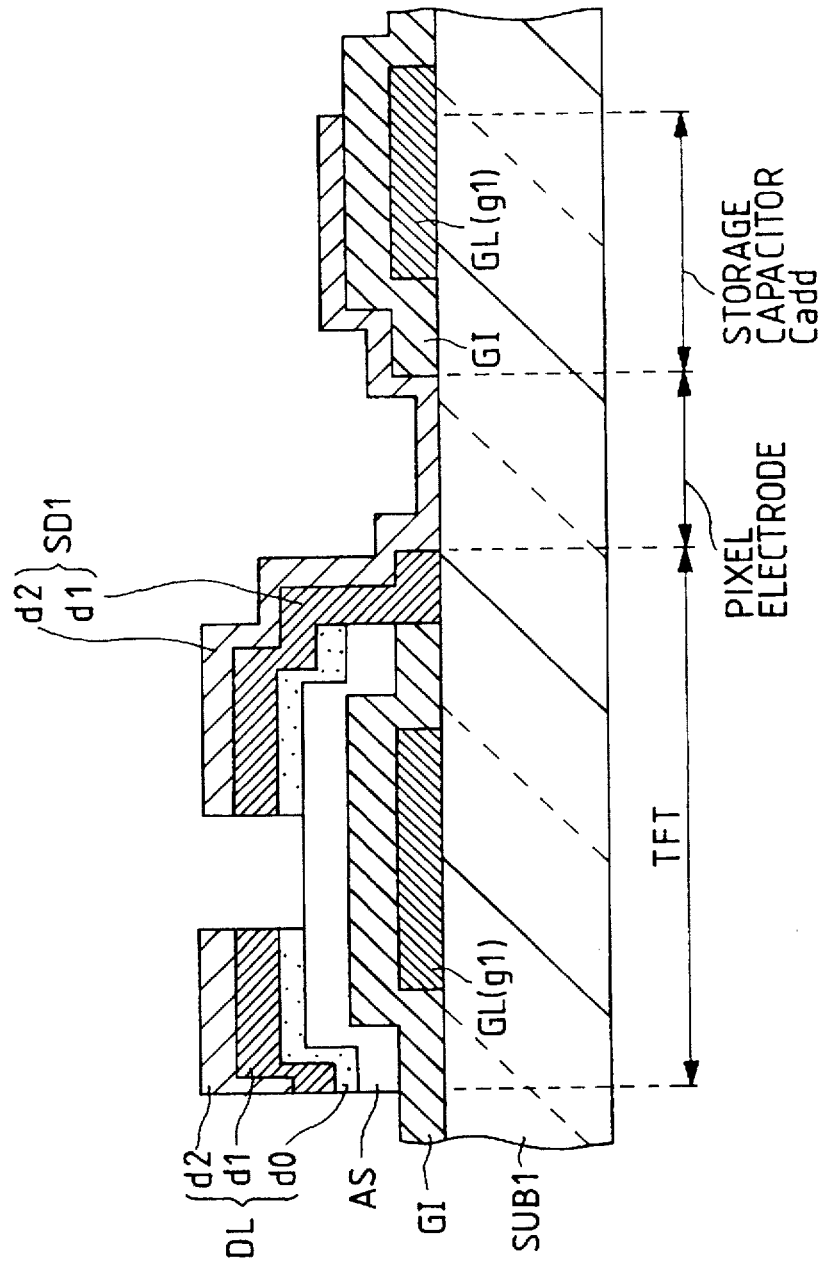
FIG. 16 is a cross-sectional view corresponding to the step G in FIG. 9.

Next, the first conductive film d1 is selectively etched again using the pattern-formed transparent conductive film d2, and further, the source electrode SD1 and the data line DL is separated by etching the N-type amorphous silicon (the process (G), FIG. 16).

Then, a silicon nitride film is formed by a plasma CVD apparatus. After forming a mask by the photo-treatment (fifth photo-treatment), the silicon nitride film is etched to form the passivation film PSV1 at a region except middle portion of the pixel electrode and others (the process (H), FIG. 3).

Features of the present invention are further described in detail referring to FIGS. 17 and 18. In accordance with the manufacturing method of the present embodiment, the step portion which does not cause wire breakage can be obtained even if using ITO which readily causes wire breakage by the step existing under it.

FIG. 17 is a cross sectional view showing a structure soon after the chromium etching in the third photo-treatment indicated in FIG. 9. The photoresist PRES used as a mask is remained on the first conductive film d1.

The end portions of the N-type semiconductor layer d0, the i-type semiconductor layer AS, and the gate insulating film GI, all of which are the steps under the first conductive film d1, are formed in preferable tapers, respectively. The tapers of these three layers are obtained by a continuous etching using $SF_6$ gas of which main component is fluorine (F). Ratios of etching speed by $SF_6$ gas are, taking the speed for the glass substrate SUB1 as 1, approximately 20 for the gate insulating film GI, 80 for the i-type semiconductor layer AS, and approximately 160 for the N-type semiconductor layer d0, such as N-type amorphous Si>i-type amorphous Si>Si nitride film>glass substrate. Accordingly, when etching for the N-type amorphous silicon film is finished and the etching for the i-type amorphous silicon film starts, the upper N-type amorphous silicon is side etched, and consequently, the end portion of the i-type amorphous silicon film is manufactured in a taper (slope) with an angle of approximately 70°–75°. When etching for the i-type amorphous silicon film is finished and the etching for the silicon nitride film starts, the upper N-type amorphous silicon and the i-type amorphous silicon film are consecutively side etched, and consequently, the end portion of the i-type semiconductor layer AS is manufactured in a taper (slope) with an angle of 50°, and the end portion of the gate insulating film GI is shaped in a taper of 20°. Accordingly, a probability of causing wire breakage of the first conductive film d1 formed on them is decreased less than a case where there exists steep steps without taper. Further, if the tapered portion is coated with the first conductive film d1, the taper angle at the upper surface of the first conductive film d1 formed on the taper becomes approximately 10°.

On the other hand, the end portion of the first conductive film d1 itself on the glass substrate SUB1 becomes approximately 10° by adding an adequate amount of ceric nitrate ammonium and nitric acid to the etching solution.

Next, a case is considered wherein the N-type semiconductor layer d0 and the i-type semiconductor layer AS on the conductive film g1 of the storage capacitor are selectively removed by etching using the photoresist PRES as a mask as shown in FIG. 17. At the etching, a dry etching gas flows as the arrows indicate in FIG. 17, especially, the gas flows round under the end portion of the photoresist PRES at the end portion of the first conductive film d1, and to the glass substrate SUB1 along the taper at the end portion of the first conductive film d1.

A cross sectional view after the transparent conductive film d2 made of ITO is finally coated is shown in FIG. 18. When the N-type semiconductor layer d0 and the i-type semiconductor layer AS on the gate insulating film GI or the glass substrate SUB1 are etched selectively, a mixture of $SF_6$ gas and $BCl_3$ gas is used as a dry etching gas. By adding $BCl_3$ gas, ratios of etching speed become, taking the etching speed for the glass substrate as 1, 5 for the silicon nitride film, 80 for the i-type amorphous silicon film, and 160 for the N-type amorphous silicon film. Therefore, even if the i-type semiconductor layer AS and the N-type amorphous silicon film of the storage capacitor are etched, the silicon nitride film can be left with a preferable selective ratio. In this process, as the etching speed of the gate insulating film GI is small as ¼ of the etching speed of the i-type semiconductor layer AS, the gate insulating film is side etched when the i-type amorphous silicon is etched. Consequently, the taper angle TH3 of the silicon nitride film of the storage capacitor decreases to 15°–20°, the same as the taper angle TH1 of the silicon nitride film under the first conductive film d1, and becomes preferable for coating the transparent conductive film d2. Further, the etching speed of the glass substrate SUB1 under the first conductive film d1 is remarkably small as previously described, and the taper angle TH 2 is 3°. Furthermore, although it is not shown in the figure, the taper angle of the upper surface of the CVD film at the end portion of the conductive film g1 of the storage capacitor is as small as 5°, because the CVD film is preferably coated. The above described advantages can not be lost even if an insulating film having an equivalent dry etching speed against fluorine group gas to the glass substrate such as, for example, a tantalum oxide film is formed on the transparent glass substrate SUB1.

In accordance with the present embodiment, a liquid crystal display apparatus having a high aperture ratio and bright image display can be realized.

Because the TFT substrate composing the display panel can be manufactured by a simple process including only five photoresist treatments, an advantage to provide a cheap liquid crystal display apparatus can be achieved. Further, wire breakage of the ITO can be prevented and production yield can be improved because the taper angle at all of the steps under the conductive film made of ITO which readily causes wire breakage can be made equal to or less than 10°.

(Embodiment 2)

Figure 19:
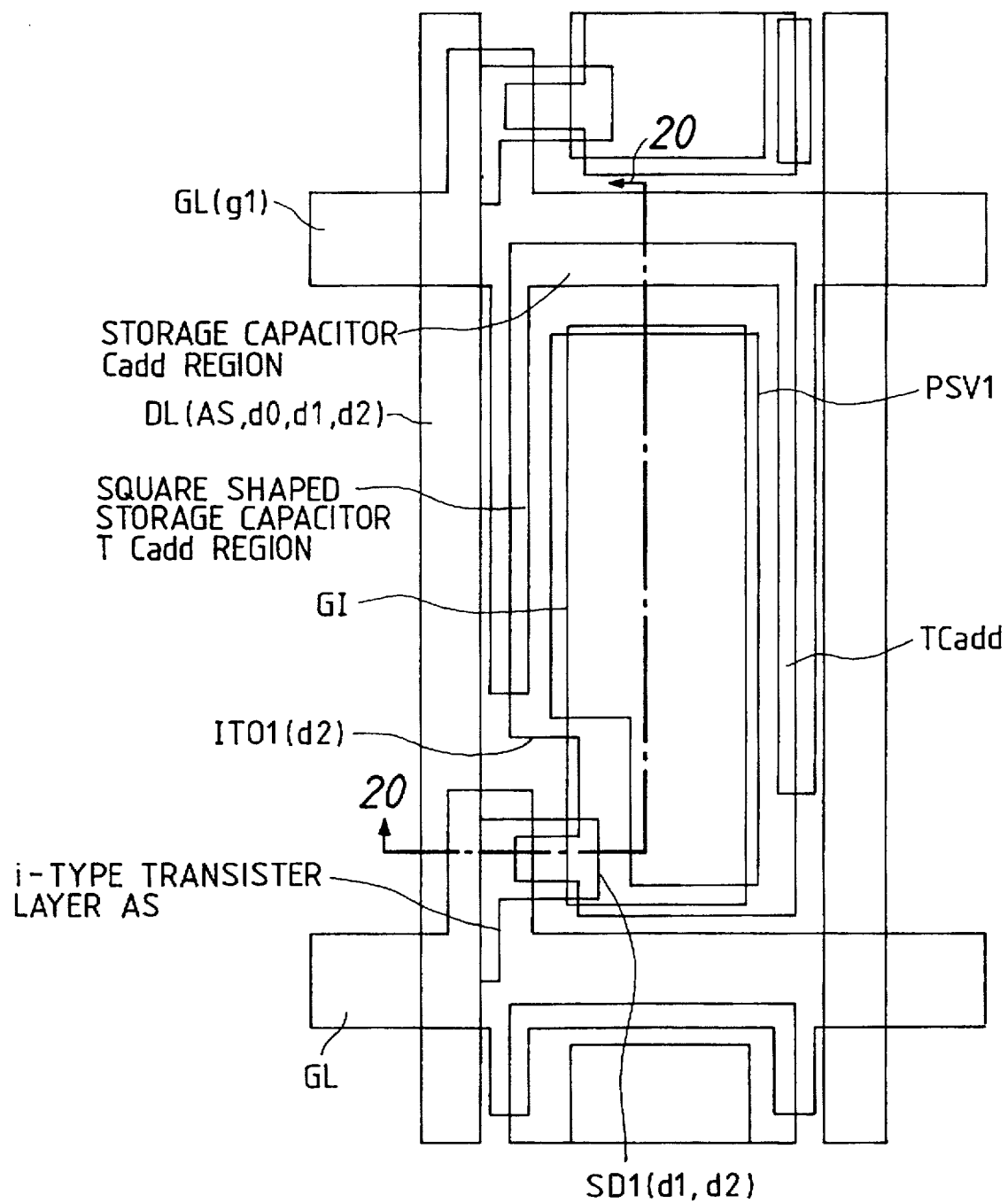
FIG. 19 is a plan view of the patterns of a pixel and layers in its vicinity on a TFT substrate in the embodiment 2.
Figure 20:
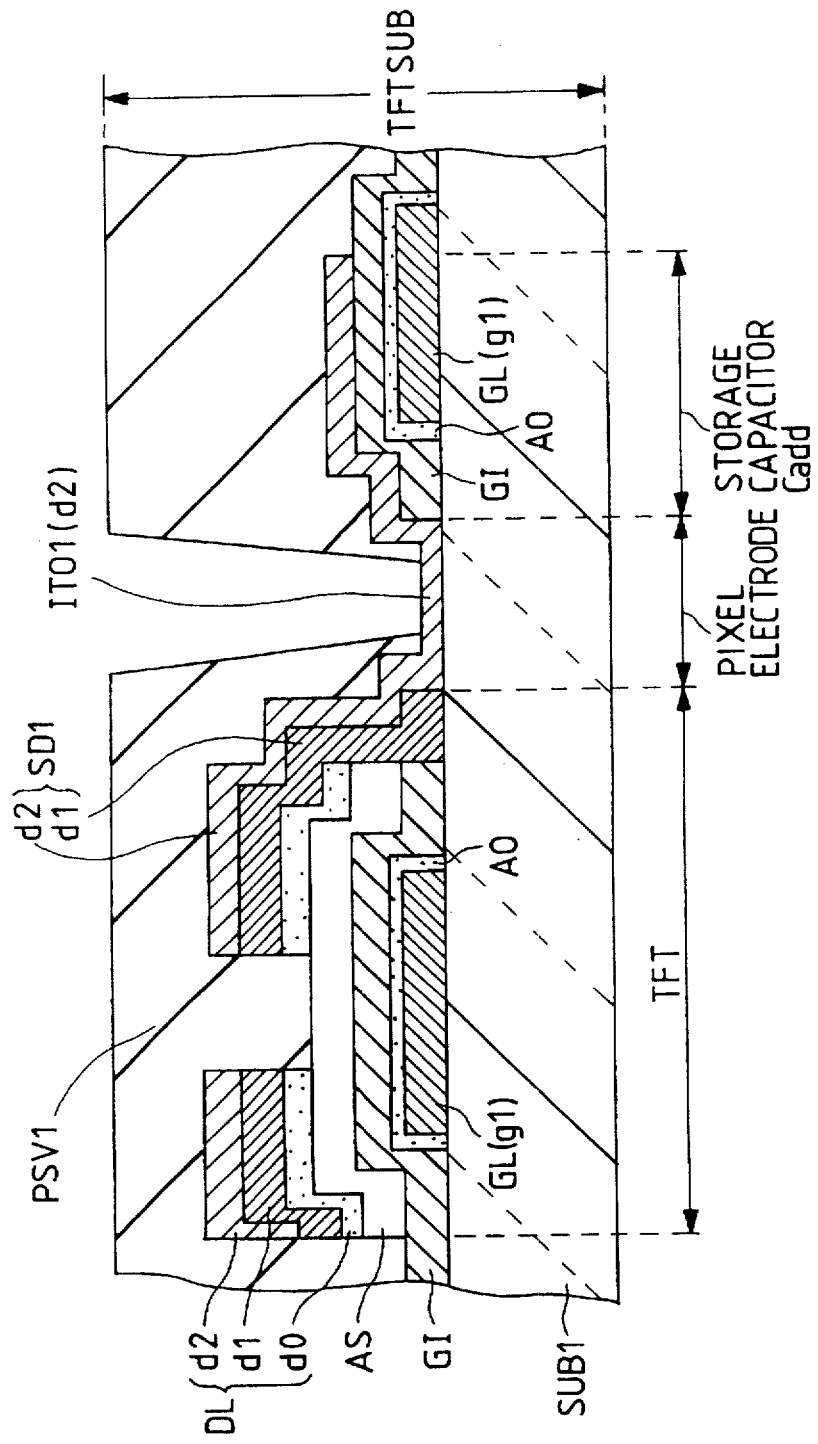
FIG. 20 is a cross-sectional view taken along the line 20—20 in FIG. 19.

The second embodiment of the present invention is explained referring to FIGS. 19 and 20. FIG. 19 is a plan view of a pixel, and FIG. 20 is a cross sectional view taken along the line 20—20 in FIG. 19.

A different point in the present embodiment from embodiment 1 is that, as a structure to improve the aperture ratio, the shielding electrode SKD for a floating electrode is not used, but a rectangular storage capacitor TCadd is enlarged and only the enlarged rectangular storage capacitor is used for shielding. Accordingly, in comparison with the embodiment 1, an effect to shield voltage change of the data line DL by the rectangular storage capacitor TCadd which is a part of the gate line GL becomes large. Therefore, generation of tailing of images vertically in the image display, so called generation of shading, can be suppressed.

However, in this case, a value of the storage capacitance, which is determined by an area of intercrossing region of the gate line GL and the pixel electrode, increases, and a delay time of scanning voltage applied to the gate line GL increases. Therefore, in order to overcome the above increase of the delay time, the conductive film g1 of the gate line GL is made of low resistant wiring material whose main component is aluminum instead of chromium in embodiment 1 as shown in FIG. 20. In order to prevent decreasing the withstand voltage of the gate insulating film by effects of blocking and others, the main surface of the aluminum is anodized to form anodized oxide film AO. As described above, by using low resistant aluminum, images having preferable quality can be displayed without increasing delay time of the scanning voltage even if the storage capacitance increases.

Further, as preferable tapers at the step portions under the transparent conductive film ITO1 can be obtained as same as the embodiment 1, wire breakage of the transparent conductive film can be prevented, and the production yield is improved.

(Embodiment 3)

Figure 21:
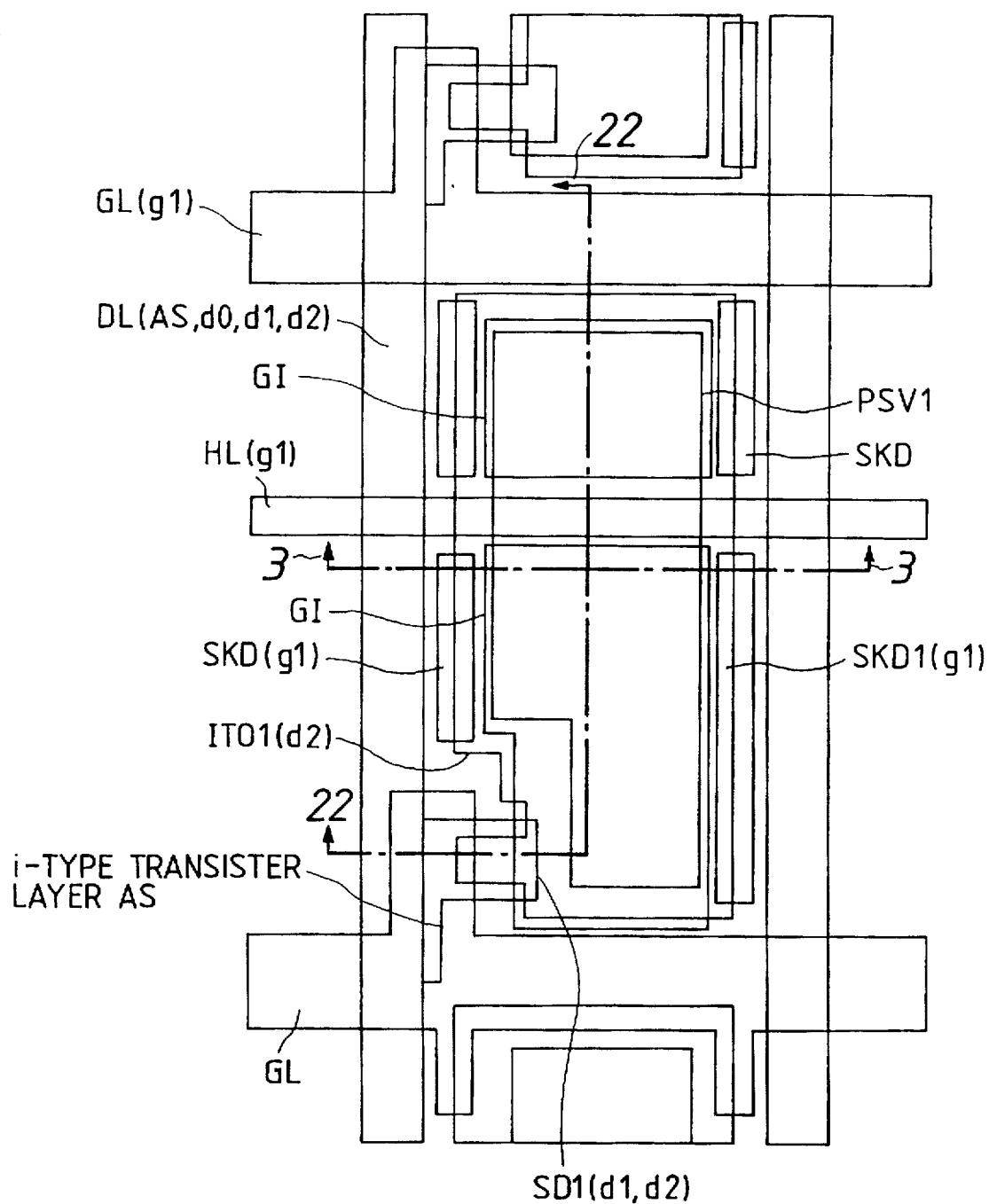
FIG. 21 is a plan view of the patterns of a pixel and layers in its vicinity on a TFT substrate in the embodiment 3.
Figure 22:
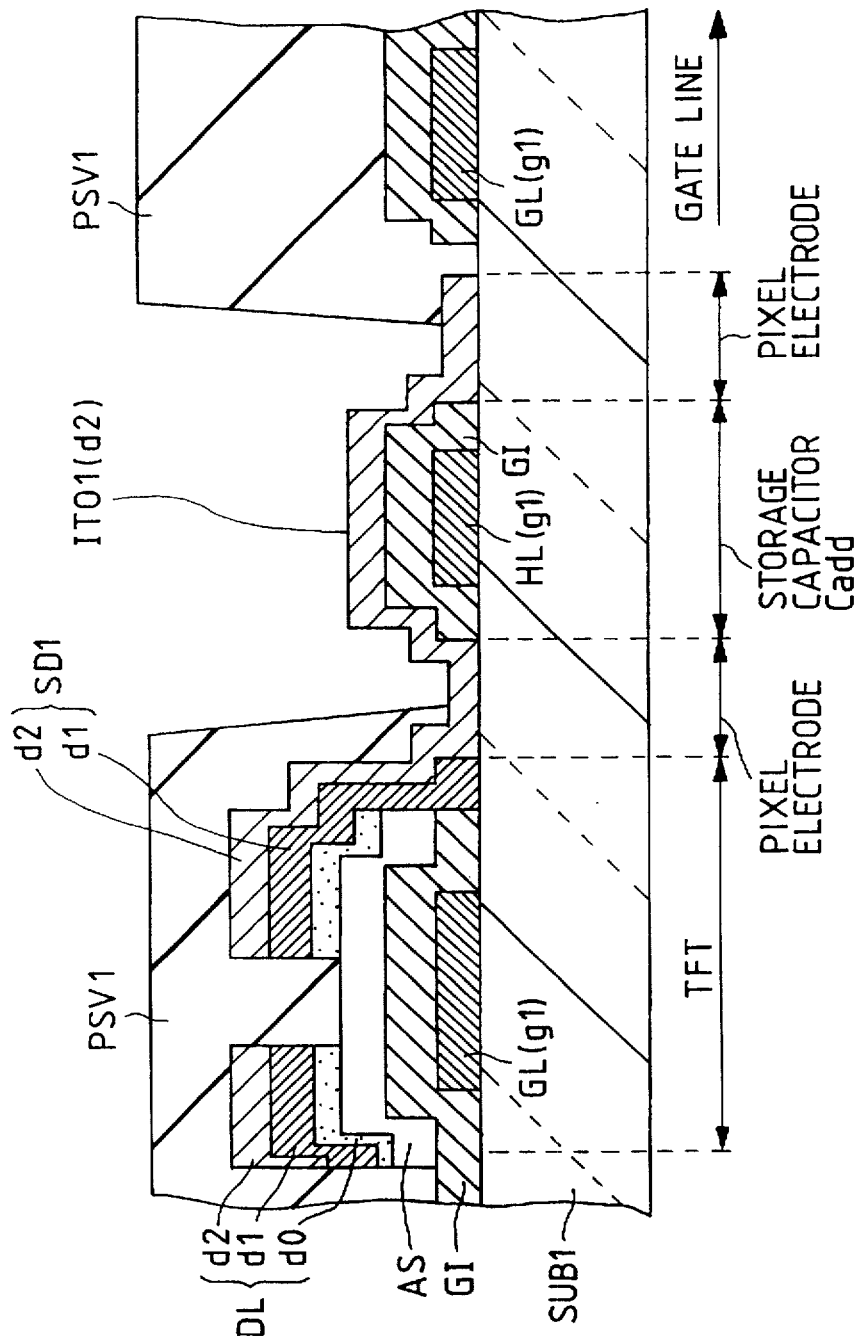
FIG. 22 is a cross-sectional view taken along the line 22—22 in FIG. 21.

The third embodiment of the present invention is described hereinafter referring to FIGS. 21 and 22. FIG. 21 is a plan view of a pixel, and FIG. 22 is a cross sectional view taken along the line 22—22 in FIG. 21. The cross sectional view taken along the line 22—22 in FIG. 21 is the same as FIG. 1 of the embodiment 1.

A different point in the present embodiment from the embodiments 1 and 2 is that a storage capacitor line HL is newly formed in parallel to the gate line GL, and a storage capacitor Cadd is formed at an intercrossing region of the storage capacitor line HL and the pixel electrode. Accordingly, in comparison with the embodiments 1 and 2, the capacitance which is a load to the gate line GL can be decreased. Therefore, as the delay time of the scanning voltage applied to the gate line GL can be decreased, the same advantage as the embodiment 1 such that a large size display is possible even if a chromium film is used as the conductive film g1 of the gate line GL.

As shown in FIG. 22, the storage capacitor line HL is formed of the conductive film g1 as same as the gate line GL. The gate insulating film GI under the pixel electrode has two openings holding the storage capacitor line HL between. The end portion of the gate insulating film GI on the storage capacitor line HL has a preferable taper as well as the embodiment 1, and no wire breakage of the transparent electrode ITO1 can be expected.

(Embodiment 4)

The fourth embodiment of the present invention is described hereinafter referring to FIGS. 23 and 24. FIG. 24 is a plan view of a pixel, and FIG. 23 is a cross sectional view taken along the line 1—1 in FIG. 24.

Figure 23:
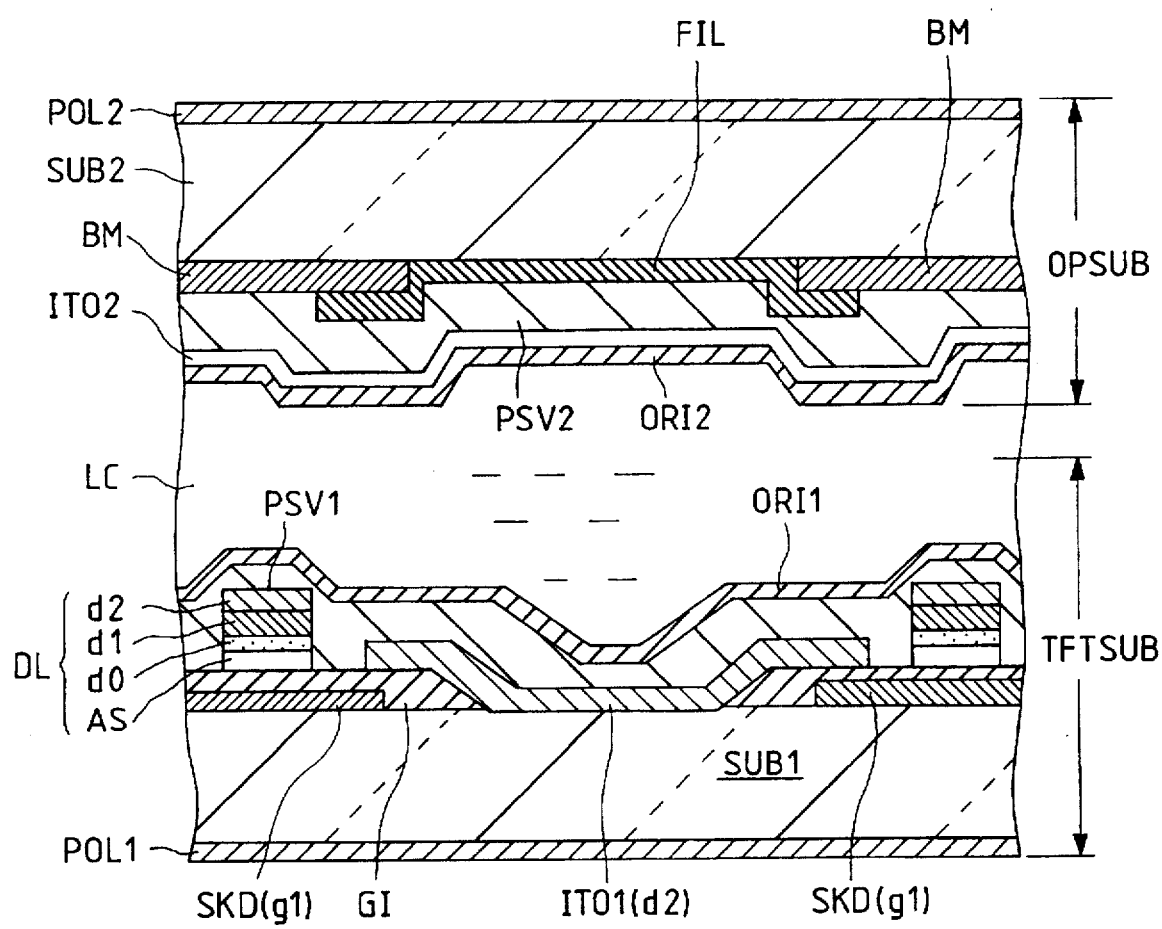
FIG. 23 is a cross-sectional view taken along the line 1—1 in FIG. 24.
Figure 24:
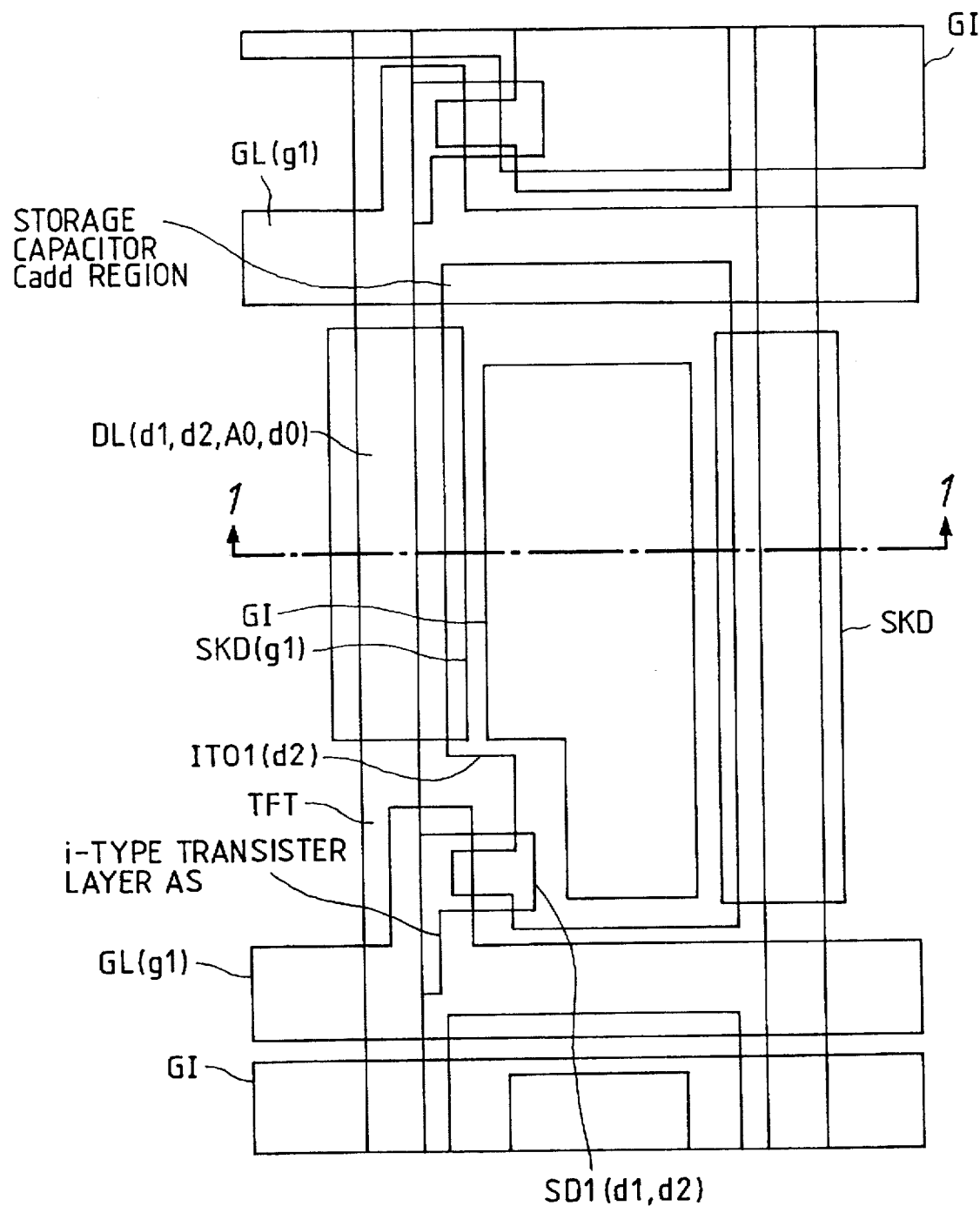
FIG. 24 is a plan view of the patterns of a pixel and layers in its vicinity on a TFT substrate in the embodiment 4.

A different point of the present embodiment from the other embodiment is that, as shown in FIG. 23, the shielding electrode SKD made of the gate line material g1 shields all of the portion under the data line DL, and extends to under the pixel electrode ITO1. Accordingly, in an extreme case, a black matrix BM to be provided at the color filter substrate OPTSUB becomes unnecessary. Therefore, in the present embodiment, the aperture ratio can be increased, and consuming power of the liquid crystal display can be decreased. If the same consuming power as the other embodiment is used, the brightest liquid crystal display apparatus can be realized. As shown in FIG. 24, the shielding electrode SKD is made of the gate line material g1. However, the gate line GL itself is not formed, and the shielding electrode forms a floating electrode which is not controlled by the gate line GL and the data line DL. Therefore, a large scale liquid crystal display apparatus can be realized without increasing the capacitances of the above lines.

(Embodiment 5)

Figure 25:
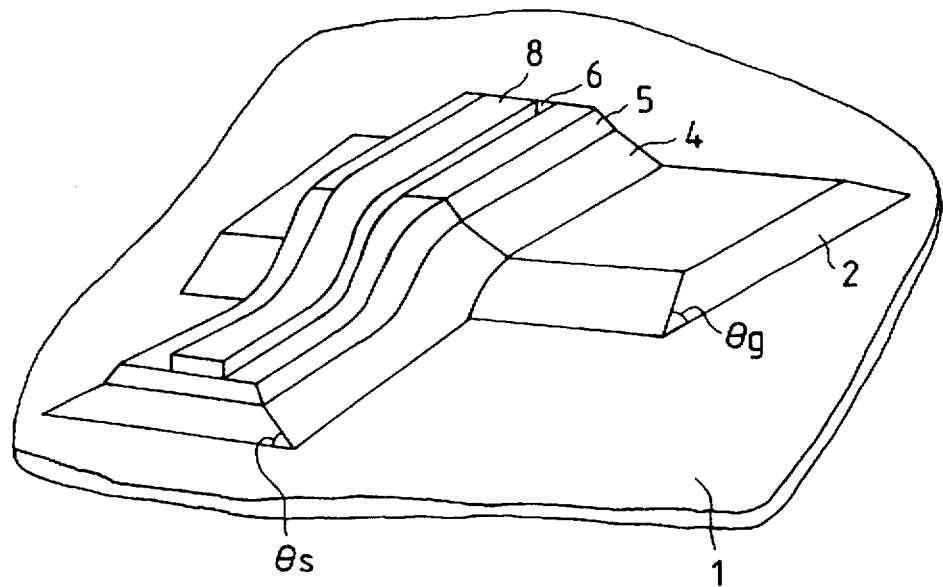
FIG. 25 is a schematic perspective view of a thin film transistor of the present invention.

FIG. 25 is a perspective view of a thin film transistor (TFT) formed on a glass substrate. A chromium film of 100 nm thickness is formed on a substrate 1 by a sputtering method. The film is manufactured to form scanning signal lines and gate electrodes 2 by a photoetching process. Subsequently, end portions of the gate electrode are manufactured to form tapers having a taper angle of θg by wet etching process.

A silicon nitride film, a non-doped amorphous silicon film, and a phosphorus-doped amorphous silicon film are continuously formed and laminated as for respectively a gate insulating layer 4, a semiconductor layer 5, and a contact layer 6 by a plasma chemical vapor deposition method (plasma CVD). Then, the above described laminated films are manufactured for patterns. In order to minimize the number of masks and steps, the patterns are manufactured simultaneously with a same mask by a dry etching process. As the dry etching process has isotropic etching characteristics, side etching proceeds at a surface of the laminated film to form a taper having a taper angle of θs as shown in FIG. 25.

As for image signal lines, pixel electrodes, source and drain electrodes, an ITO film of approximately 300 nm thick is formed by sputtering method, and pattern manufacturing is performed by a wet etching process using a photoresist. Channel regions are formed by dry etching of the contact layer 6 using the same photoresist. Finally, a silicon nitride film is formed as for a passivation layer by a plasma CVD method.

Figure 26A:
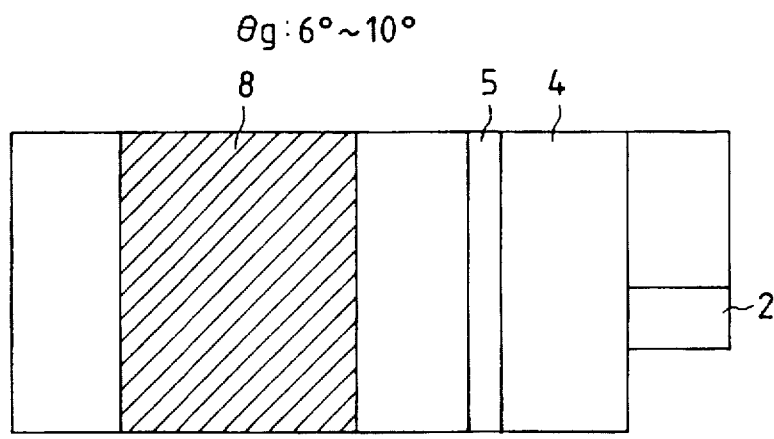
FIGS. 26(a), 26(b), and 26(c) are plan views of the thin film transistor of the present invention.
Figure 26B:
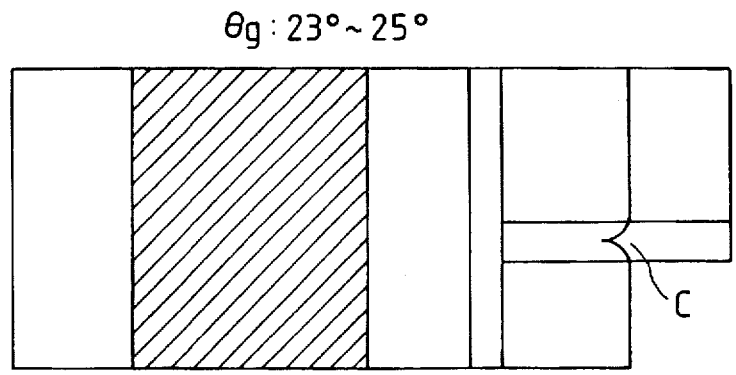
Figure 26C:
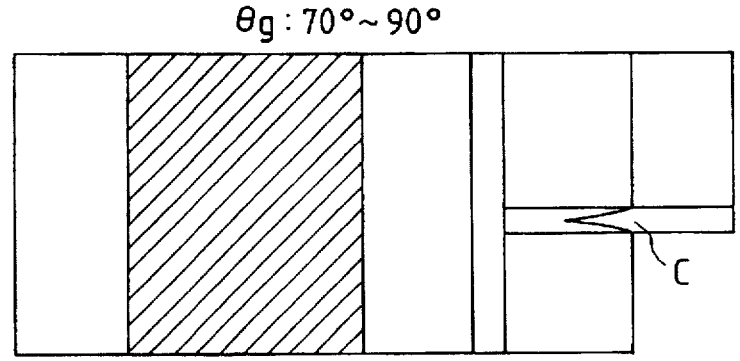

FIGS. 26(a), 26(b), and 26(c) are plan views of an overriding portion of the gate electrode 2 of the semiconductor pattern when the taper angle θs of the gate insulating layer 4 is set at a constant, approximately 10° (taper ratio= 0.18), and the taper angle θg at the end portion of the chromium film, i.e. the gate electrode 2, varies.

In a case when the taper angle θg of the gate electrode 2 is in a range of 6°–10° (taper ratio=0.1–0.18), no crack was observed at the overriding portion of the silicon nitride film. Accordingly, it can be concluded that no crack is generated when the θg is as low as equal to or less than 10°.

In a case when the θg is approximately three times θs, that is, in a range of 23°–25° (taper ratio=0.47–0.7), a crack (C) equivalent to approximately ¼ of the length at the slope of the taper was generated. However, the electric characteristics of the TFT was not influenced at all by such a crack as above described degree at the slope of the taper of the gate insulating layer 4.

Figure 27:
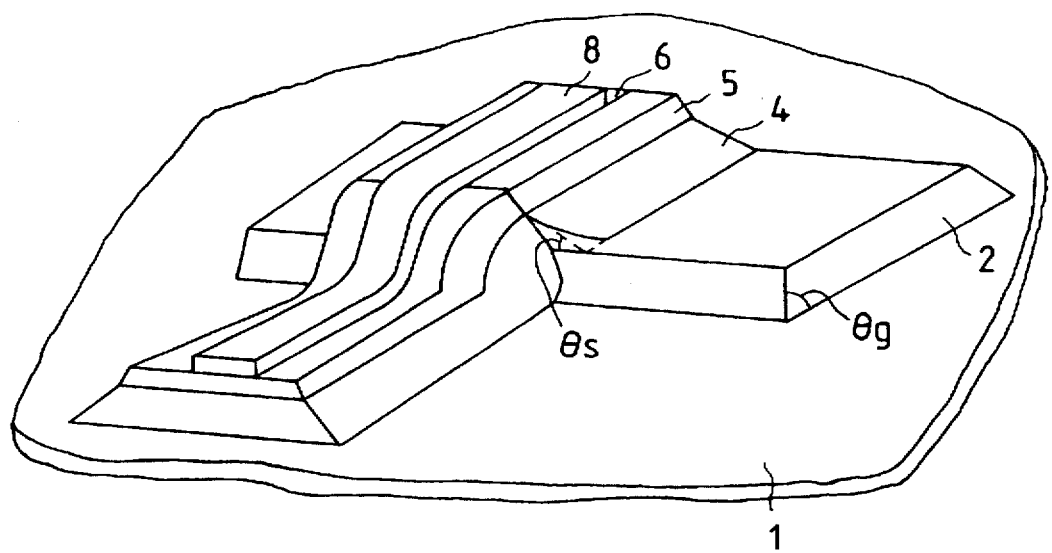
FIG. 27 is a schematic perspective view of a thin film transistor of the prior art.

However, in a case when the θg becomes more than four times θs, that is, in a range of 70°–80° (taper ratio=2.7–5.6), a crack (C) more than ½ of the length at the slope of the taper was generated. FIG. 27 is a perspective view of the TFT at the above described case. Leak current of the gate electrode 2 and the semiconductor layer 5 increase, and short circuits between the gate electrode 2 and the drain electrode 8 occur frequently when the crack (C) is large.

The θs can be formed in a range of approximately 10°–30° by a dry etching process using $SF_6$ gas.

Further, θg can be controlled by changing the composition the of an etchant for the chromium film, i.e. the gate electrode 2. The etchant is a mixture including nitric acid, ceric nitrate ammonium, perchloric acid, and water. Among the above components, the concentration of ceric nitrate ammonium determines etching speed mainly in a vertical direction. Nitric acid enters into a contacting boundary between the chromium film and the photoresist, and lateral etching proceeds by entry of ceric nitrate ammonium into the boundary subsequently to nitric acid. A ratio of the above vertical and lateral etching speed is a key factor for determining the taper angle θg at the end portion of the chromium film as the gate electrode 2.

Figure 28:
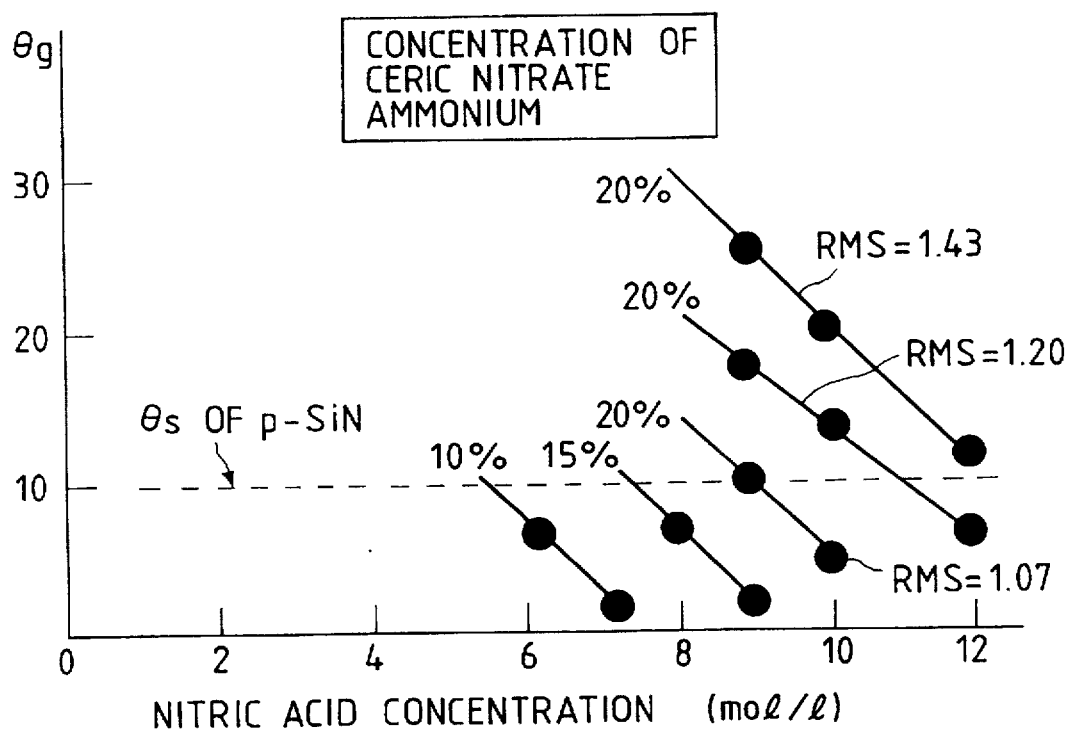
FIG. 28 is a graph indicating a relationship between concentrations of nitric acid and ceric nitrate ammonium in an etching agent and a taper angle θg of the gate electrode.

In FIG. 28, shown are ratios of nitric acid and ceric nitrate ammonium for forming the taper angle θg of the gate electrode 2 equal to or less than three times of the taper angle θs of the gate insulating layer 4 when the θs is set as 10°.

In a case when concentration of ceric nitrate ammonium is 20% and nitric acid concentration is 9 mol/l, θg becomes 6°–10°, and if the concentration is 8 mol/l, forming the taper becomes impossible.

On the contrary, when concentration of ceric nitrate ammonium is 15%, the etching speed in a vertical direction becomes smaller than the speed at 20%. Consequently, the etching speed in a lateral direction increases relatively, and θg becomes small. That means, 2°–3° is obtained at nitric acid concentration of 9 mol/l, and 70° is obtained at 8 mol/l.

Further, θg varies depending on adhesiveness of the chromium film and the etching resist in addition to the composition of the etchant. One of the factors to determine the adhesiveness is roughness (RMS) at the surface of the chromium film.

In FIG. 28, a relationship between the surface roughness (RMS) of the chromium film and the θg is shown. For a film having a small RMS such as 1.07 (having small convexities and concavities at the surface), the θg is 10° (when nitric acid concentration is 9 mol/l). On the contrary, even with the same etchant, for a film having an RMS of 1.20 (having large convex and concave at the surface), the θg becomes 20°, and for a film having RMS of 1.43 (having further large convexities and concavities at the surface), the θg becomes 25°. Therefore, the surface roughness (RMS) of the film can be regarded as an important factor for taper etching of the gate electrode.

Figure 29A:
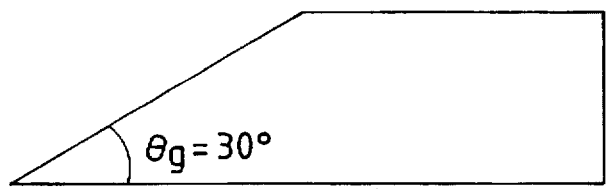
FIGS. 29(a), 29(b), and 29(c) are schematic cross-sectional views indicating shapes of the taper at the end portion of the line pattern.
Figure 29B:
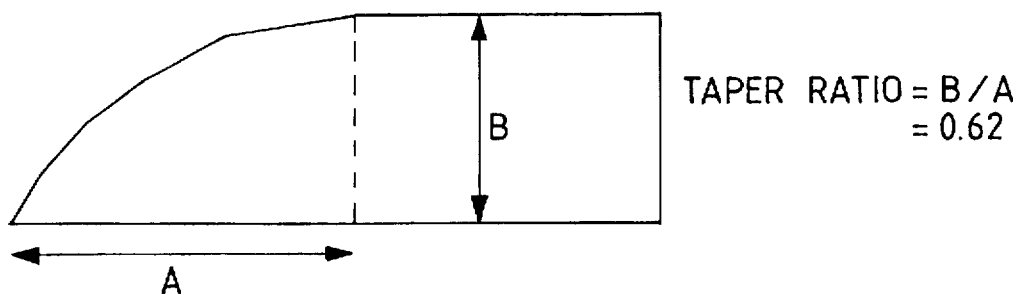
Figure 29C:
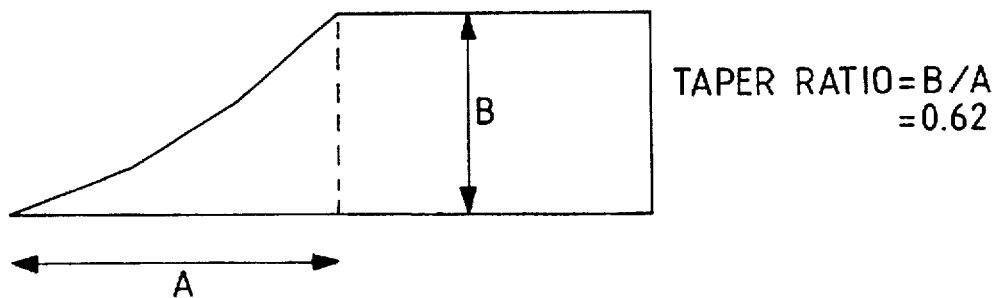

Various shapes at the end portion of the pattern are formed by manufacturing the, taper such as the one shown in FIG. 29 (a) wherein the slope of the taper can be approximated by a straight line, and the others shown in (b) and (c) which are hardly approximated by a straight line. The taper angle of the case (a) is easily defined, but the cases (b) and (c) are difficult to define the taper angles. In these cases, the taper angle is defined by a ratio of the width of the taper portion, i.e. a recessive distance from the lower end to the upper end (bottom length: A) and the film thickness (B), so-called a taper ratio (B/A). Accordingly, both the taper ratios (B/A) of the (b) and (c) are defined as same 0.62.

Figure 30:
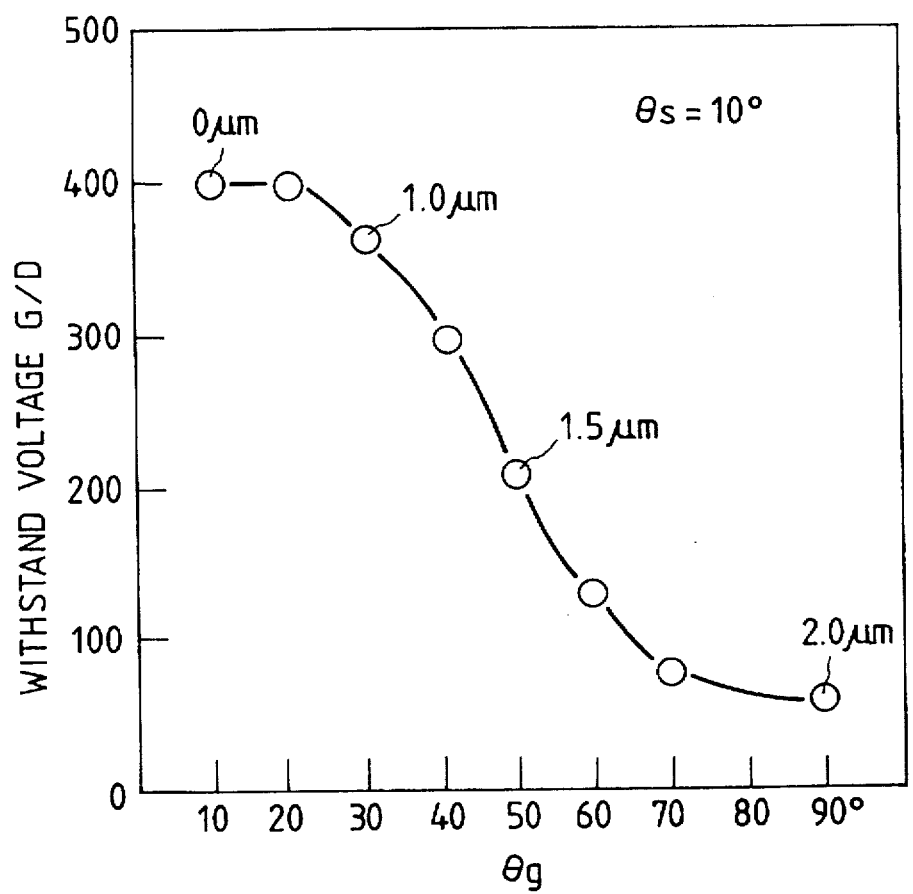
FIG. 30 is a graph indicating a relationship between the taper angle θg of the gate electrode and withstand voltage between gate/drain electrodes.

FIG. 30 is a graph indicating a relationship between the taper angle θg of the gate electrode 2 and withstand voltage G/D. Cutting lengths of the crack (C) in the gate insulating layer 4 at the overriding portion of the gate electrode 2 are shown at respective measuring points.

When the taper angle θs of the silicon nitride film, i.e. the gate insulating layer 4, is set as 10°, the withstand voltage G/D has a high value such as 400 V when θg is 10°. At the above case, the cutting length of the crack (C) was zero. If θg is 30°, a crack (C) of approximately 1 μm long is generated, but the crack does not influence the withstand voltage G/D. However, if θg exceeds 30°, the withstand voltage decreases rapidly. The decrease is caused by extending the cutting length of the crack (C) in the gate insulating layer beyond ½ of the slope length of the taper.

Figure 31A:
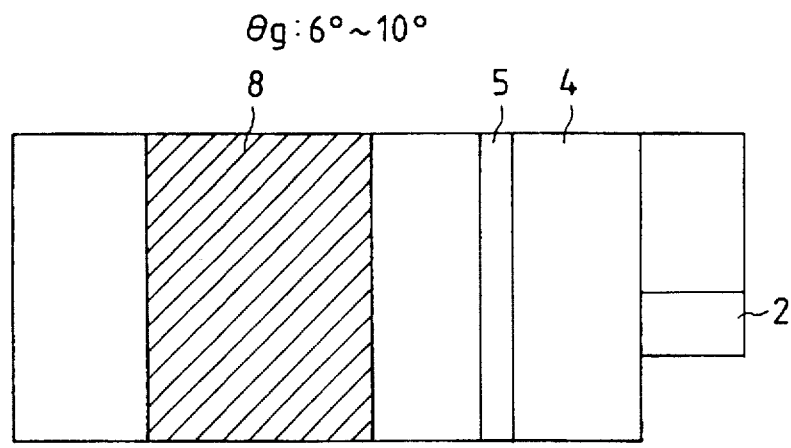
FIGS. 31(a), 31(b), and 31(c) are plan views of an overriding portion of the gate electrodes.
Figure 31B:
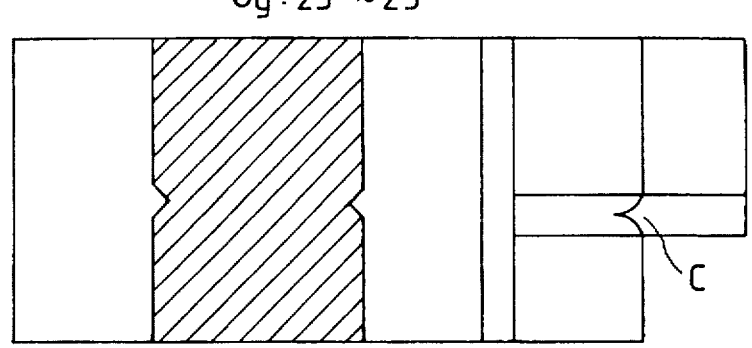
Figure 31C:
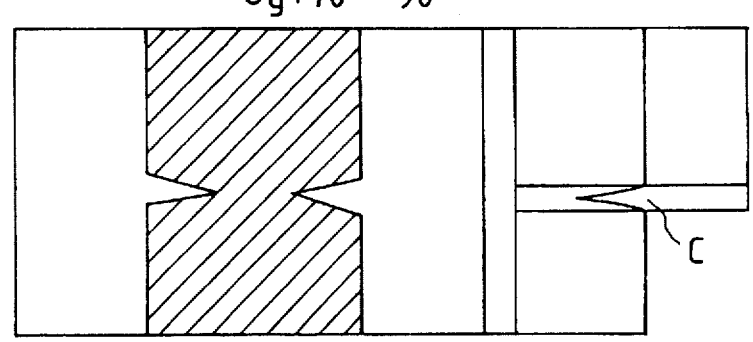

As for other effects of forming the taper at the end portion of the gate electrode 2 than the above description, wire breakage can be prevented. As shown in FIG. 31, when a material having a weak step coverage for the film, such as poly a ITO film, is used for the drain electrode 8, the crack generated by etching enters into the drain electrode 8, and wire breakage of the electrode 8 can be caused (hereinafter, called D-breakage). The D-breakage can be suppressed by setting the taper angle of the gate electrode 2 as 10°–40° (or the taper ratio as 0.2–0.8).

The θg equal to or less than 30° can be formed by using a chromium film etchant, wherein 4–7 parts by weight of nitric acid is mixed with 1 part by weight of ceric nitrate ammonium, for etching the gate electrode 2. Especially, a case when 5 parts by weight of nitric acid is added, θg of approximately 10° can be obtained. However, formation of a desired taper angle is difficult with nitric acid of less than 4 parts by weight, because the θg becomes too large to the θs, and a crack is generated in the gate insulating layer 4. If the nitric acid content exceeds 7 parts by weight, the θg becomes too small depending on the adhesive condition of the chromium film and the photoresist, and preciseness of the pattern formation of the gate electrode 2 decreases.

If the present embodiment is applied to the manufacturing process for the shielding electrode SKD in FIG. 23, wire breakage of ITO1 can be decreased.

(Embodiment 6)

When conductive material having a relatively a large specific resistance (Ta, ITO, $MoSi_2$, $TaSi_2$, $CrSi_2$, $WSi_2$, TiN, TaN) is used for manufacturing the gate electrode 2, it is necessary to make its resistance small by increasing its thickness in order to decrease gate delay of the electrode. However, if the thickness increases, the step at the end portion of the gate electrode 2 becomes large, and consequently, cracks are readily generated at the overriding portion of the gate insulating layer 4 on the gate electrode 2.

In order to make the resistance approximately equal to the one when a chromium film of 100 nm thickness is used for the gate electrode 2, for instance, forming film thickness of 105 nm for Ta, 1160 nm for poly ITO, 190–775 nm for silicides such as $MoSi_2$, $TaSi_2$, $WSi_2$, and $TiSi_2$, and 500 nm for TiN and TaN are necessary.

The generation of the crack (C) and G/D short circuit caused by the large step at the end portion of the gate electrode 2 made of the above material could be suppressed by making the θg (or taper ratio) of the gate electrode 2 equal to or less than two times of the θs (or taper ratio) of the gate insulating layer 4.

On the other hand, when conductive material having a relatively low resistance, for example, such as Al, Cu, Au, Ni, Mo, and W is used for manufacturing the gate electrode 2, the thickness of the electrode must be thin. It is possible to make the electrode with film thickness of 20 nm for Al, 13 nm for Cu, 53 nm for Ni, 44 nm for Mo, and 43 nm for W. In the above case, the generation of the crack (C) and G/D short circuit could be suppressed by making the θg (or taper ratio) of the gate electrode 2 equal to or less than three times of the θs (or taper ratio) of the gate insulating layer 4.

(Embodiment 7)

When $SiO_2$ film having a low dielectric constant, or a film made of two layers of $SiO_2$ and SiN, is used for manufacturing the gate insulating layer 4, it is necessary to make a thickness of the film thin as much as the amount equivalent to a difference of the dielectric constant in order to obtain the same capacitance as the one in a case when the insulating layer is made of a single layer of SiN.

For example, in order to obtain the same capacitance with a SiN film having a dielectric constant of 2.0 and a film thickness of 350 nm, it is necessary to form a film of 200 nm thick when $SiO_2$ is used. In the above case, the crack (C) is readily generated at the overriding portion of the $SiO_2$ gate insulating layer 4 on the gate electrode 2, and a generating ratio of electric failure increases.

In the above case, the generation of the crack (C) and G/D short circuit could be suppressed by making the θg of the gate electrode 2 as 10° (or taper ratio: 0.17) substantially equal to 10° of the θs (or taper ratio: 0.17) of the gate insulating layer 4.

(Embodiment 8)

Figure 32:
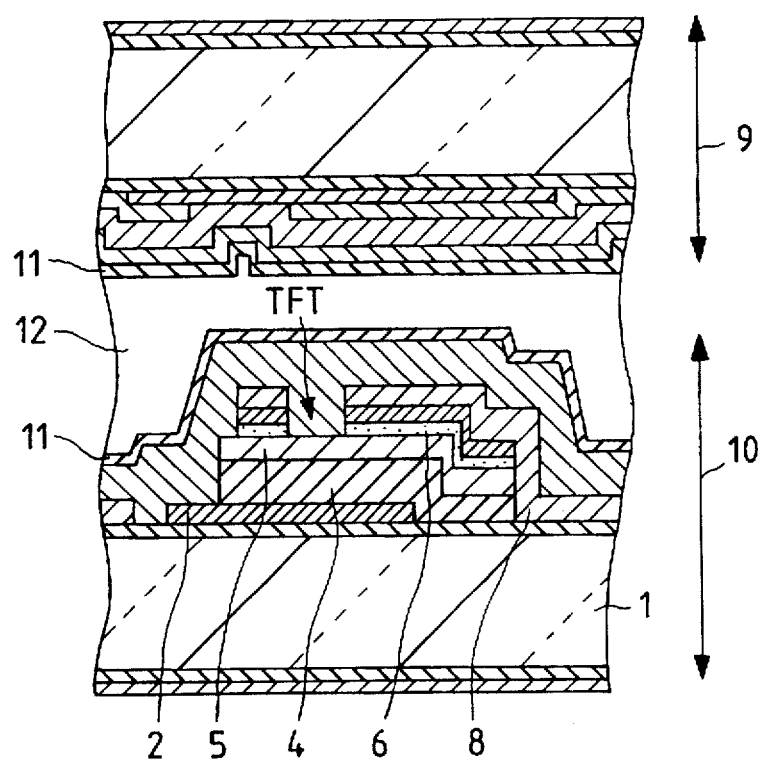
FIG. 32 is a schematic cross-sectional view of a liquid crystal display apparatus of the present invention.

FIG. 32 is a schematic cross sectional view of a liquid crystal display apparatus using the TFT of the present invention. The liquid crystal display apparatus of TFT drive type was manufactured by the steps of preparing a liquid crystal substrate 10 having the TFT formed by the above embodiment of the present invention and a counter substrate 9, arranging alignment films 11 at facing surfaces of both the above substrates 10, 9, and enclosing a liquid crystal 12 between the above alignment films. With the liquid crystal display apparatus, G/D short circuit, leak current, and wire breakage of the ITO drain electrode at the overriding portion of the semiconductor pattern and the drain electrode 8 on the gate electrode 2 can be prevented, and the liquid crystal display apparatus (TFTLCD) having preferable reliability can be manufactured with a preferable production yield.

What is claimed is;
1. A liquid crystal display apparatus comprising:
a first substrate,
a plurality of gate lines formed on said first substrate,
a plurality of data lines intersecting with said gate lines,
a plurality of thin film transistors formed near the intersections of said gate lines and said data lines, each thin film transistor including an insulating layer formed on said gate lines and said first substrate, and a semiconductor layer formed on said insulating layer.
a plurality of pixel electrodes electrically connected to said thin film transistors,
a shielding electrode extending in parallel to said data lines, said shielding electrode being separated and insulated from said data lines and said gate lines,
a second substrate, and
a liquid crystal between said first and second substrates;
wherein said insulating layer has an opening portion under each of said pixel electrodes, and a peripheral portion of each of said pixel electrodes and said shielding electrode is disposed to overlap with each other and is insulated from each other by said insulating layer.

2. A liquid crystal display apparatus comprising:
a first substrate,
a plurality of gate lines formed on said first substrate,
a plurality of data lines intersecting with said gate lines,
a plurality of thin film transistors formed near the intersections of said gate lines and said data lines, each thin film transistor including an insulating layer formed on said gate lines and said first substrate, and a semiconductor layer formed on said insulating layer.
a plurality of pixel electrodes electrically connected to said thin film transistors,
a shielding electrode of a stripe-shape extending in parallel to said data lines, said shielding electrode being separated and insulated from said data lines and said gate lines,
a second substrate including a transparent common electrode, and
a liquid crystal between said first and second substrates;
wherein a central portion of each of said pixel electrodes contacts with said first substrate, and a peripheral portion of each of said pixel electrodes and said shielding electrode is disposed to overlap with each other and is insulated from each other by said insulating layer.

3. A liquid crystal display apparatus comprising:
a first substrate,
a plurality of gate lines formed on said first substrate,
a plurality of data lines intersecting with said gate lines,
a plurality of thin film transistors formed near the intersections of said gate lines and said data lines, each thin film transistor including an insulating layer formed on said gate lines and said first substrate, and a semiconductor layer formed on said insulating layer.
a plurality of pixel electrodes electrically connected to said thin film transistors,
a shielding electrode of a stripe-shape extending in parallel to said data lines, said shielding electrode being separated and insulated from said data lines and said gate lines,
a second substrate including a transparent common electrode, an opaque shielding film having an opening portion arranged in a matrix formed on said second substrate, and
a liquid crystal between said first and second substrates;
wherein said shielding electrode and said opaque shielding film are disposed to overlap with each other, a central portion of each of said pixel electrodes contacts with said first substrate, and a peripheral portion of each of said pixel electrodes and said shielding electrode is disposed to overlap with each other and is insulated from each other by said insulating layer.

4. A liquid crystal display apparatus as claimed in any one of claims 1, 2 and 3, wherein a transparent conductive film providing said pixel electrodes extends to source electrodes of said thin film transistors.

5. A liquid crystal display apparatus as claimed in any one of claims 1, 2 and 3, wherein said insulating layer is provided from a same layer as a gate insulating film of said thin film transistors.

6. A liquid crystal display apparatus as claimed in any one of claims 1, 2 and 3, wherein said shielding electrode is separated and insulated from said data lines and said semiconductor layer by said insulating layer.

7. A liquid crystal display apparatus as claimed in any one of claims 1, 2 and 3, wherein said shielding electrode is formed of a same layer as said gate lines and electrically separated from said gate lines.

8. A liquid crystal display apparatus as claimed in any one of claims 1, 2 and 3, wherein said shielding electrode is disposed to overlap with said data lines.

9. A liquid crystal display apparatus as claimed in any one of claims 1, 2 and 3, wherein said shielding electrode is disposed to cover a part of said data lines in a plane view.

10. A liquid crystal display apparatus as claimed in any one of claims 1, 2 and 3, wherein said shielding electrode is positioned spaced from said data lines.

11. A liquid crystal display apparatus as claimed in any one of claims 1, 2 and 3, further comprising:
a plurality of conductive lines in parallel with said gate lines, provided to form capacitor elements, said capacitor elements including said insulating layer sandwiched between said conductive lines and said pixel electrodes, and said shielding electrode is formed between said gate lines and said conductive lines.

12. A liquid crystal display apparatus as claimed in claim 2 or 3, wherein said central portion of each of said pixel electrodes contacts with an orientation film.

13. A liquid crystal display apparatus comprising:
a substrate,
a plurality of gate lines formed on said substrate,
a plurality of data lines intersecting with said gate lines,
a plurality of thin film transistors formed near the intersections of said gate lines and said data lines, each of the thin film transistors including an insulating layer formed on said gate lines and said first substrate, a semiconductor layer formed on said insulating layer, and a source electrode and a drain electrode formed on said semiconductor layer,
a plurality of pixel electrodes electrically connected to said thin film transistors,
a capacitor element, comprising (1) a gate line adjacent to a gate line whereon a respective thin film transistor is formed, (2) an insulating film, and (3) a pixel electrode, the insulating film being sandwiched between said pixel electrode and said gate line adjacent to the gate line whereon the respective thin film transistor is formed, a second substrate, and a liquid crystal between said first and second substrates;

wherein a first taper angle (TH1), of said insulating layer of said thin film transistors, is larger than a second taper angle (TH2), of said insulating film of said capacitor element.

14. A liquid crystal display apparatus comprising:

a substrate, a plurality of gate lines formed on said substrate, a plurality of date lines intersecting with said gate lines, a plurality of thin film transistors formed near the intersections of said gate lines and said data lines, each of the thin film transistors including an insulating layer formed on said gate lines and said first substrate, a semiconductor layer formed on said insulating layer, and a source electrode and a drain electrode formed on said semiconductor layer, a plurality of pixel electrodes electrically connected to said thin film transistors, a plurality of conductive lines in parallel with said gate lines, said conductive lines forming capacitor elements together with an insulating film and said pixel electrodes, the insulating film being sandwiched between the conductive lines and the pixel electrodes so as to provide the capacitor elements, a second substrate, and a liquid crystal between said first and second substrates;

wherein a first taper angle, of said insulating layer of said thin film transistors, is larger than a second taper angle, of said insulating film of said capacitor elements.

15. A liquid crystal display apparatus as claimed in claim 13 or 14, wherein each of said pixel electrodes is constituted by a transparent conductive film extending to said source electrode by crossing over a region with said first taper angle of said insulating layer, and extending to said capacitor element by crossing over a region with said second taper angle of said insulating film.

16. A liquid crystal display apparatus as claimed in claim 15, wherein a central portion of each of said pixel electrodes contacts with said first substrate.

17. A liquid crystal display apparatus as claimed in claim 13 or 14, wherein said semiconductor layer and a conductive film of said thin film transistors have substantially a same plane pattern.

18. A liquid crystal display apparatus as claimed in claim 13 or 14, wherein said gate line is coated with an anodic oxide film of a conductive material composing said gate lines.

* * * * *